(12) United States Patent
Jeon et al.

(10) Patent No.: US 8,916,876 B2
(45) Date of Patent: Dec. 23, 2014

(54) WHITE ORGANIC LIGHT EMITTING DIODE DISPLAY DEVICE AND METHOD OF FABRICATING THE SAME

(75) Inventors: Eun-Ju Jeon, Gyeonggi-Do (KR); Hee-Suk Pang, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 86 days.

(21) Appl. No.: 13/334,325

(22) Filed: Dec. 22, 2011

(65) Prior Publication Data

US 2012/0161141 A1   Jun. 28, 2012

(30) Foreign Application Priority Data

Dec. 24, 2010  (KR) .......................... 10-2010-0134892

(51) Int. Cl.
| | |
|---|---|
| *H01L 29/04* | (2006.01) |
| *H01L 29/10* | (2006.01) |
| *H01L 27/32* | (2006.01) |
| *H01L 51/52* | (2006.01) |
| *H01L 27/12* | (2006.01) |

(52) U.S. Cl.
CPC ........... *H01L 27/322* (2013.01); *H01L 51/5253* (2013.01); *H01L 2251/558* (2013.01); *H01L 2227/323* (2013.01); *H01L 2251/556* (2013.01); *H01L 27/1259* (2013.01); *H01L 27/3258* (2013.01)

USPC ............................................. 257/59

(58) Field of Classification Search
CPC ..................... H01L 2227/323; H01L 27/1259; H01L 27/322; H01L 27/3258; H01L 51/5253; H01L 27/3213
USPC ................................................ 438/29; 257/59
See application file for complete search history.

(56) References Cited

U.S. PATENT DOCUMENTS

| | | | |
|---|---|---|---|
| 2009/0251051 A1 * | 10/2009 | Hwang et al. ................ | 313/504 |
| 2009/0261716 A1 | 10/2009 | Choi et al. | |
| 2010/0026178 A1 | 2/2010 | Hwang et al. | |
| 2010/0052518 A1 | 3/2010 | Jeon et al. | |

OTHER PUBLICATIONS

Office Action dated Dec. 4, 2013, issued by the State Intellectual Property Office of China in Chinese Patent Application No. 201110461224.9.

* cited by examiner

*Primary Examiner* — Anthony Ho
(74) *Attorney, Agent, or Firm* — Morgan, Lewis & Bockius LLP

(57) ABSTRACT

According to the present invention, there is provided a white organic light emitting diode (W-OLED) display device for effectively blocking outgas generated from a color filter using silicon nitride having a low water vapor transmission rate as a passivation layer instead of a planarization layer which is an organic insulating layer, and a method of fabricating the same.

6 Claims, 36 Drawing Sheets

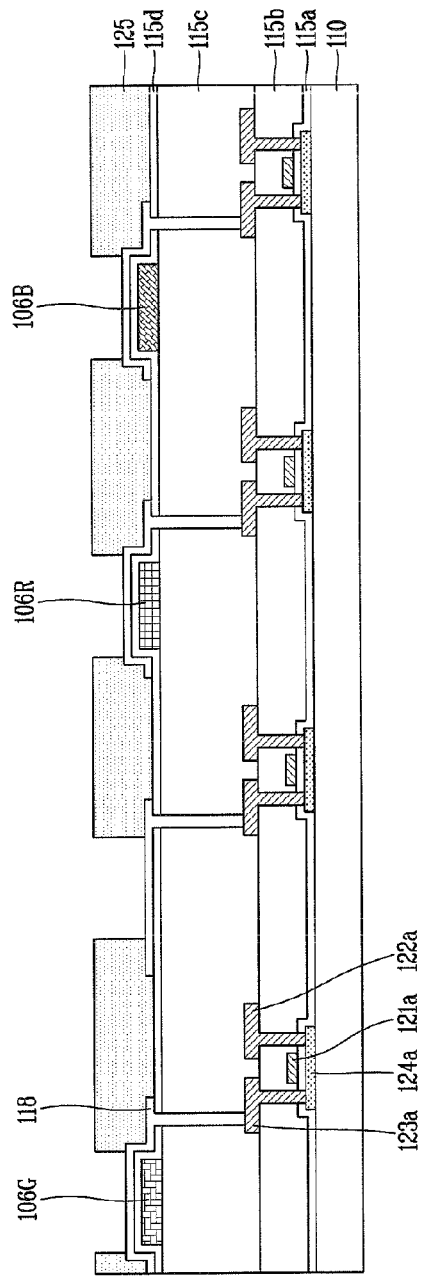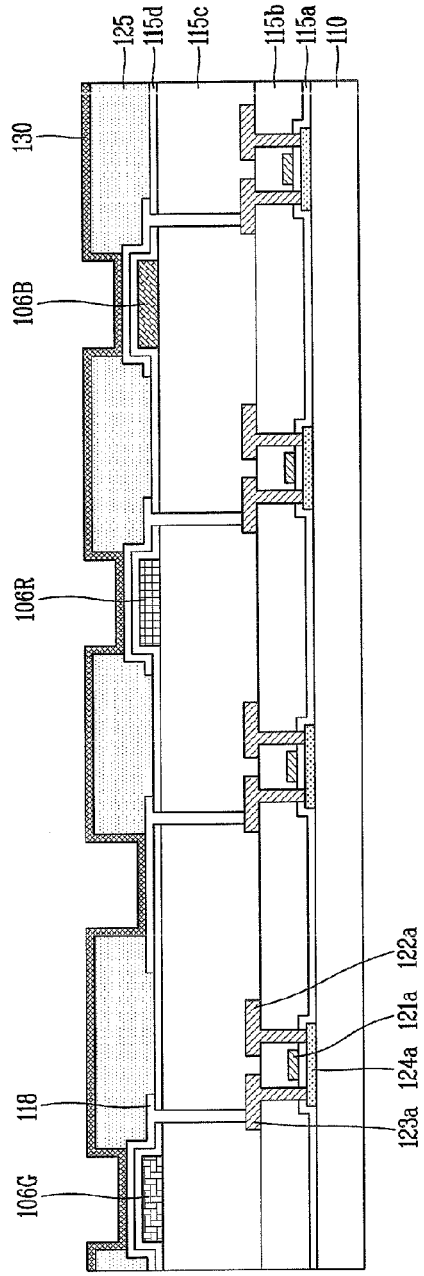

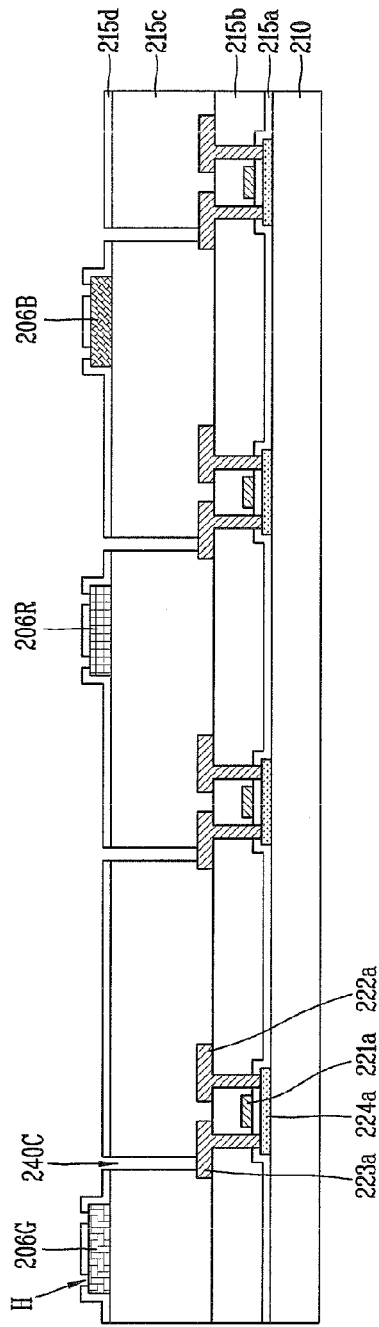
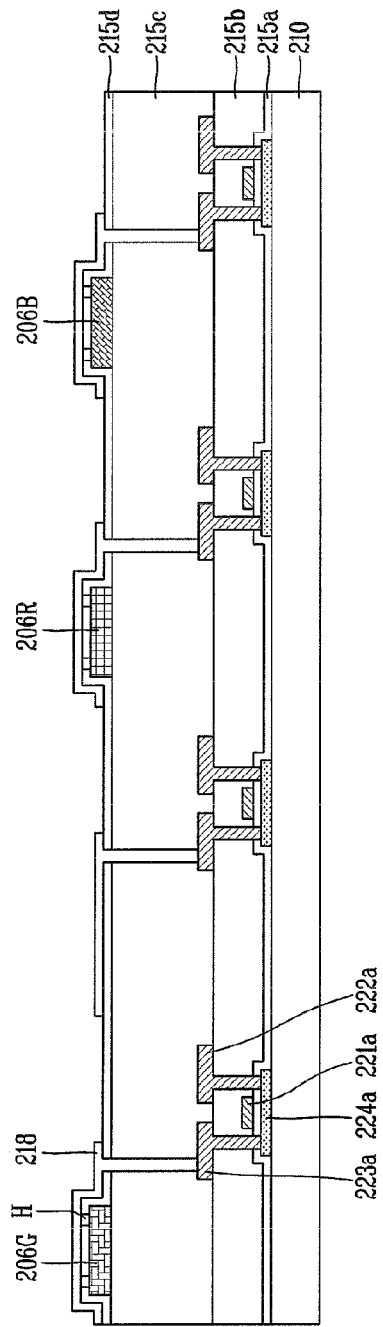

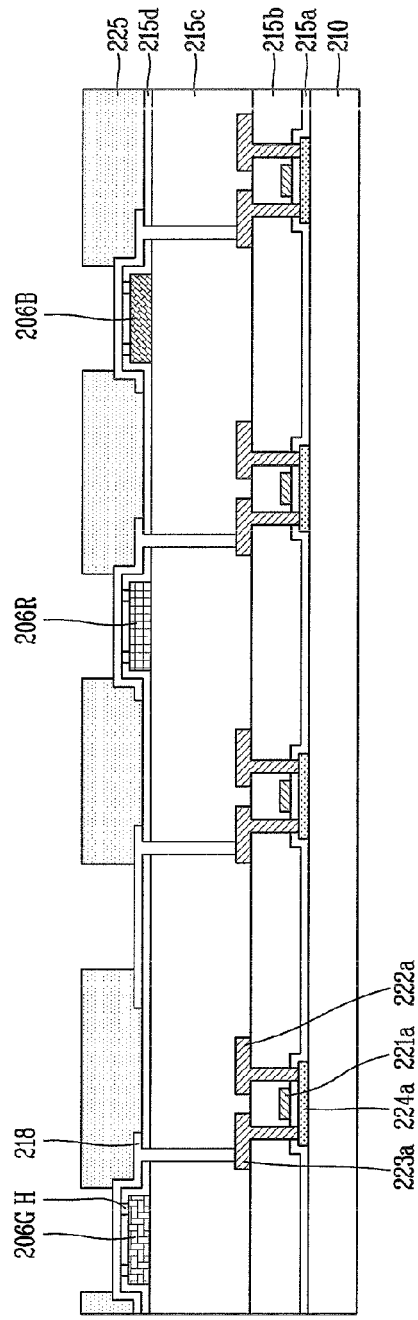
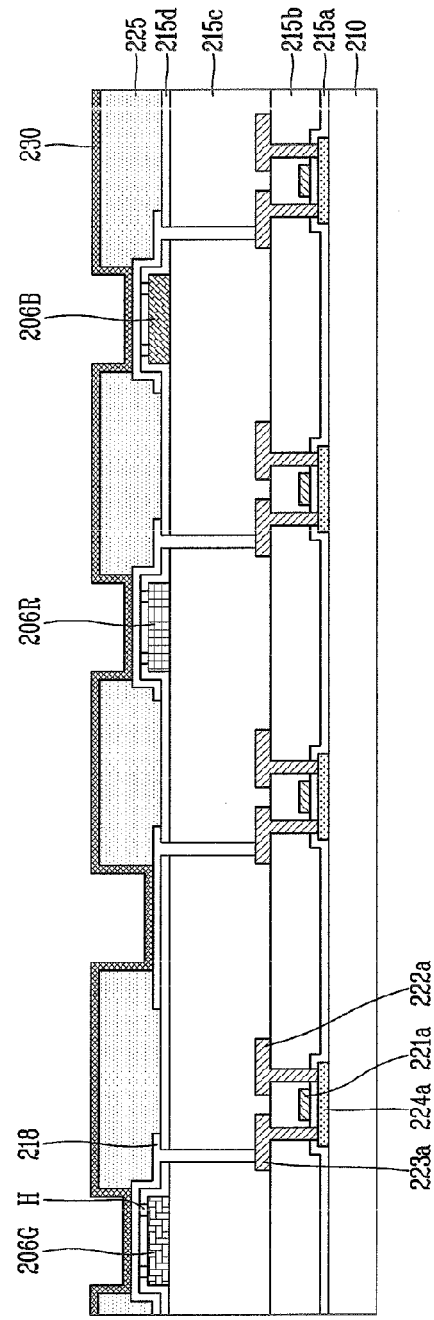

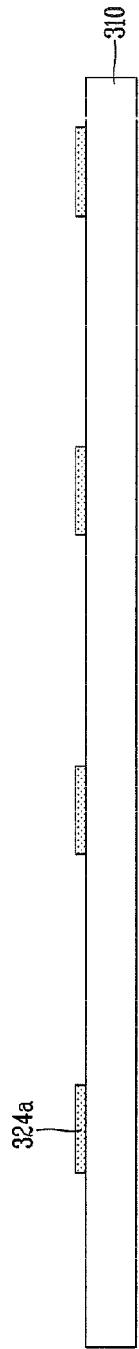
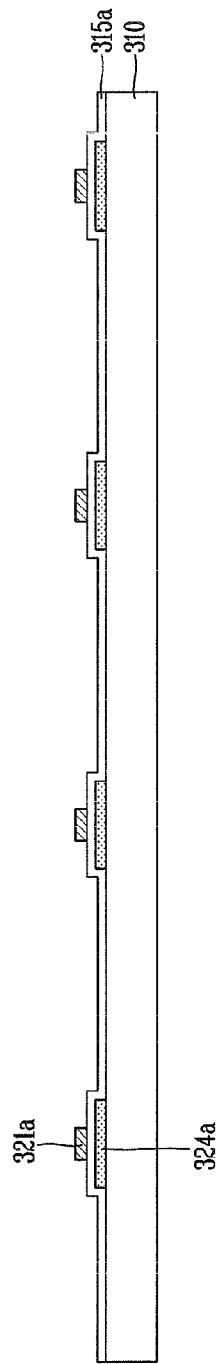
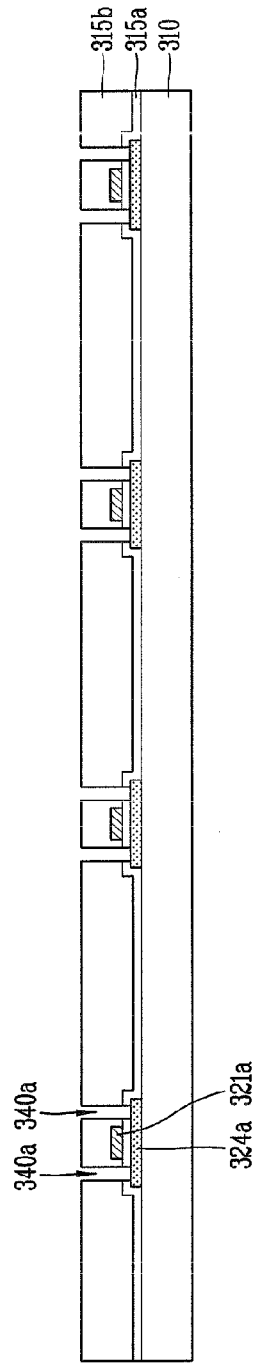
FIG. 13A
FIG. 13B
FIG. 13C

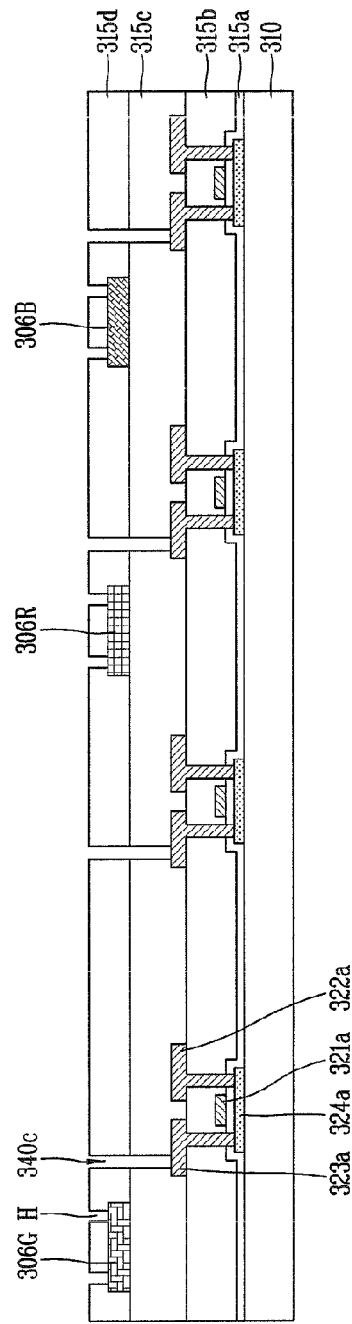
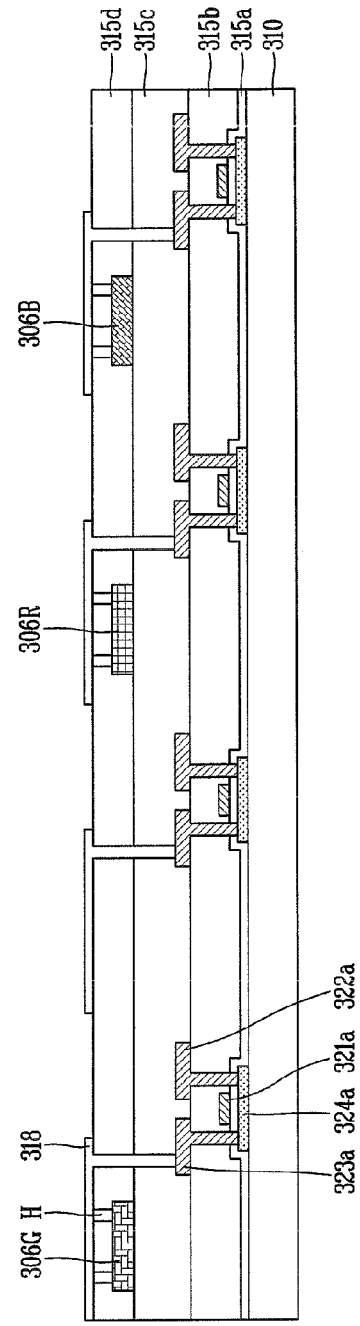

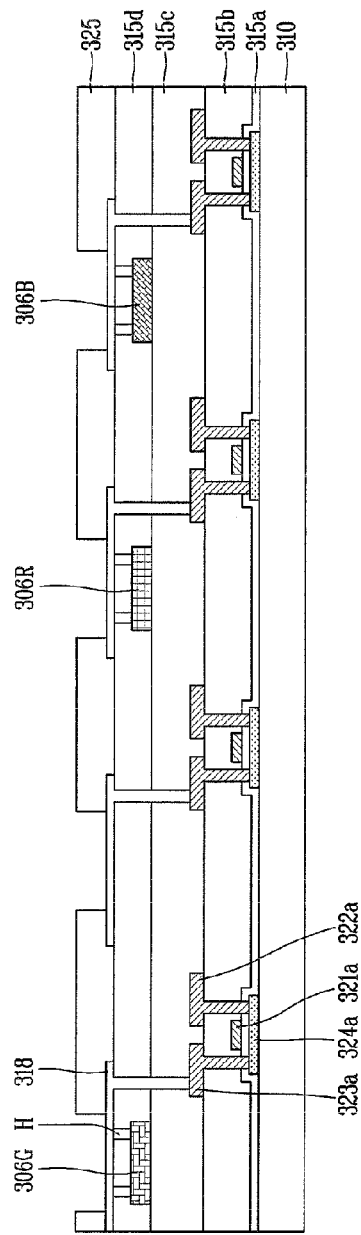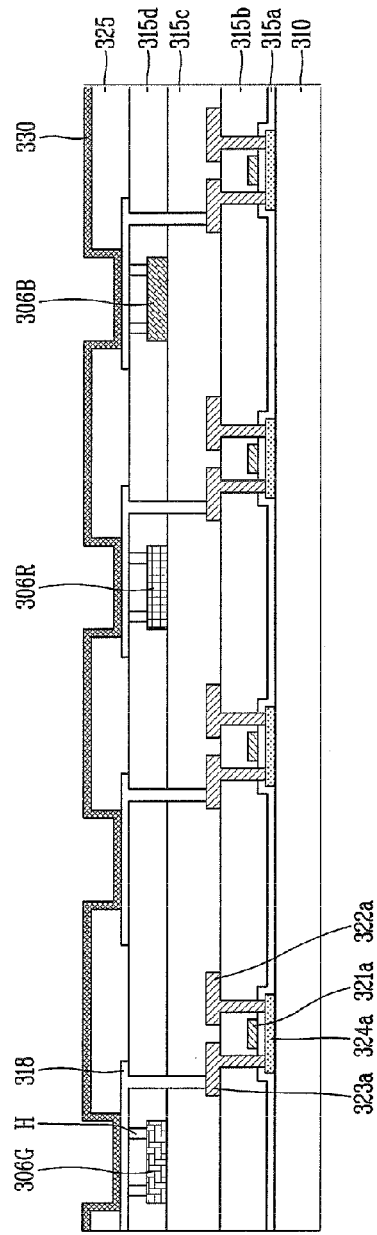

WHITE ORGANIC LIGHT EMITTING DIODE DISPLAY DEVICE AND METHOD OF FABRICATING THE SAME

CROSS-REFERENCE TO RELATED APPLICATIONS

This application claims the benefit of Korean Patent Application No. 10-2010-0134892, filed on Dec. 24, 2010, which is hereby incorporated by reference for all purposes as if fully set forth herein.

BACKGROUND OF THE INVENTION

1. Field of the Invention

The present invention relates to a white organic light emitting diode (W-OLED) display device and a method of fabricating the same.

2. Description of the Related Art

In recent years, with rising interests in information displays and increasing demands to use portable information media, researches and commercialization of light-weight and thin-profile flat panel displays (FPDs) for substituting traditional displays such as cathode ray tubes (CRTs) have been actively carried out.

In the flat panel display field, light weight and low power consumption liquid crystal display (LCD) devices have received well-deserved attention until the present time, but the liquid crystal display device is not a light emitting device but a light receiving device and also has drawbacks in brightness, contrast ratio, viewing angle, and the like, and thus the development of new display devices has been actively carried out to overcome such drawbacks.

An organic light emitting diode display device among new display devices is a self-emission type, which has excellent characteristics in viewing angle, contrast ratio, and the like compared to the liquid crystal display device. Moreover, the organic light emitting diode device does not require a backlight unit, thereby allowing light-weight and thin-profile as well as having an advantage in the aspect of power consumption. In addition, the organic light emitting diode device may have an advantage of allowing direct current low voltage driving and fast response speed, and particularly have a beneficial advantage in the aspect of fabrication cost.

Contrary to liquid crystal display devices or plasma display panels, the process of fabricating an organic light emitting diode display device may be very simple since only deposition and encapsulation processes are necessary for the fabrication process. Further, if the organic light emitting diode display device is driven with an active matrix scheme having a thin-film transistor, which is a switching element, for each pixel, then it may be possible to obtain the same brightness level even when a low current is applied, thereby having an advantage of low power consumption, fine pitch, and large-sized screen.

Hereinafter, basic structure and operation characteristic of the organic light emitting diode display device will be described in detail with reference to the accompanying drawings.

FIG. 1 is a diagram for explaining the light emitting principle of a typical organic light emitting diode display device.

A typical organic light emitting diode display device may include an organic light emitting diode as illustrated in FIG. 1. The organic light emitting diode may include organic chemical layers $30a$, $30b$, $30c$, $30d$, $30e$ formed between an anode 18 which is a pixel electrode and a cathode 28 which is a common electrode.

In this case, the organic chemical layers $30a$, $30b$, $30c$, $30d$, $30e$ may include a hole injection layer $30a$, a hole transport layer $30b$, an emission layer $30c$, an electron transport layer $30d$, and an electron injection layer $30e$.

If a drive voltage is applied to the anode 18 and cathode 28, then holes passed through the hole transport layer $30b$ and electrons passed through the electron transport layer $30d$ move to the emission layer $30c$ to form excitons, and as a result the emission layer $30c$ emits visible light.

In the organic light emitting diode display device, pixels made of organic light emitting diodes having the foregoing structure are arranged in a matrix form and such pixels are selectively controlled by using a data voltage and a scan voltage to display an image.

The organic light emitting diode display device can be classified into a passive matrix display device and an active matrix display device using TFT as a switching element. Between them, according to the active matrix scheme, TFT which is an active element is selectively turned on to select a pixel, and the light emission of the pixel is maintained by a voltage maintained at a storage capacitor.

FIG. 2 is an equivalent circuit diagram for one pixel in a typical organic light emitting diode display device, illustrating an equivalent circuit diagram for a typical pixel with 2T1C (including two transistors and one capacitor) in an organic light emitting diode display device using an active matrix scheme.

Referring to FIG. 2, a pixel of the organic light emitting diode display device using an active matrix scheme may include an organic light emitting diode (OLED), a data line (DL) and a gate line (GL) crossed with each other, a switching TFT (SW), a driving TFT (DR) and a storage capacitor (Cst).

Here, the switching TFT (SW) is turned on in response to a scan pulse supplied from the gate line (GL) to turn on a current path between its own source electrode and drain electrode. A data voltage supplied from the data line (DL) during the on-time period of the switching TFT (SW) passes through the source electrode and drain electrode of the switching TFT (SW) and applied to a gate electrode and a storage capacitor (Cst) of the driving TFT (DR).

At this time, the driving TFT (DR) controls a current flowing through the organic light emitting diode (OLED) according to a data voltage applied to its own drain electrode. Further, the storage capacitor (Cst) stores a voltage between the data voltage and the low-level power voltage (Vss), and then constantly maintains for a frame period.

In recent years, getting out of small-sized display panels for portable devices, interests have been concentrated on the medium to large-sized display market, and white organic light emitting diodes (W-OLEDs) have received a lot of attention as a technology for satisfying the market demand. The W-OLEDs may use a color filter for implementing the red, green and blue colors, and also use a planarization layer to compensate a step of the color filter.

FIG. 3 is a cross-sectional view schematically illustrating the structure of a white organic light emitting diode display device.

Referring to FIG. 3, a typical W-OLED display device may implement the red, green and blue colors using a color filter 6G, 6W, 6R, 6B. The color filter 6G, 6W, 6R, 6B may be patterned on the substrate 10, and then a photo acryl material may be used as a planarization layer $15c$ to compensate a step of the color filter 6G, 6W, 6R, 6B.

In this case, the color filter 6G, 6W, 6R, 6B may be formed with a thickness of about 1-2 μm to implement the color characteristics, and the planarization layer 15c may be formed with a thickness of about 2-3 µm to compensate the step.

An anode 18 may be formed by using indium tin oxide (ITO) subsequent to forming the planarization layer 15c.

In this case, a bank layer 25 may be formed to be overlapped with the anode 18, but outgas may be generated from the color filter 6G, 6W, 6R, 6B and planarization layer 15c during the degradation process and moved through a boundary surface of the anode 18, thereby generating pixel shrinkage in which an image is shrunk from the pixel edge. The outgas may have an effect on the reliability of the white organic emission layer 30, thus generating pixel shrinkage.

In addition, the planarization layer 15c may serve as a wave guide at an upper portion and a lower end portion of the pixel such that light generated from the white organic emission layer 30 is transmitted to generate fine light beams in a non-emission region.

For example, though vacuum annealing is carried out subsequent to depositing the organic emission layer 30, it is seen that pixel shrinkage occurs after 240 hours has passed at 80° C.

In other words, materials for the color filter 6G, 6W, 6R, 6B used in W-OLED may include dye, pigment, dispersing agent, and the like, but they may be a cause of outgas emission, thereby having an effect on the reliability of the organic emission layer 30 to generate pixel shrinkage.

SUMMARY OF THE INVENTION

The present invention is contrived to solve the aforementioned problem and an object of the invention is to provide a white organic light emitting diode display device for preventing pixel shrinkage due to outgas, and a method of fabricating the same.

Another object of the present invention is to provide a white organic light emitting diode display device for suppressing the generation of fine light beams in a non-emitting region to enhance color characteristics, and a method of fabricating the same.

Other objects and features of the present invention will be described with reference to the following description and claims of the invention.

In order to accomplish the foregoing object, there is provided a white organic light emitting diode (W-OLED) display device, including a switching thin-film transistor and a driving thin-film transistor formed on a substrate; a red, green and blue color filter formed on a substrate surface of a pixel region in which an image is displayed; a passivation layer formed on the substrate formed with the switching thin-film transistor, driving thin-film transistor, and color filter, and formed by using silicon nitride; a pixel electrode formed on the passivation layer, and connected to a drain electrode of the driving thin-film transistor; a partition formed on the substrate formed with the pixel electrode to partition the pixel region; a white organic light emission layer formed on the substrate formed with the partition; and a common electrode formed on the organic light emission layer.

Here, the device may be characterized in that the passivation layer is formed with a plurality of holes for exposing the color filter.

Further, the device may be characterized in that outgas generated from the color filter is drawn out through the holes.

The device may be characterized in that the holes are formed within the pixel region or formed out of the pixel region such as an upper portion of a data line or gate line.

The device may be characterized in that the passivation layer is formed by using silicon nitride to block outgas generated from the color filter, and formed with a thickness of 1000-5000 Å to prevent the passivation layer from being served as a wave guide.

According to the present invention, there is provided a method of fabricating a white organic light emitting diode (W-OLED) display device, and the method may include forming a switching thin-film transistor and a driving thin-film transistor on a substrate; forming a red, green and blue color filter on a pixel region in which an image is displayed; forming a passivation layer using silicon nitride on the substrate formed with the color filter; forming a pixel electrode connected to a drain electrode of the driving thin-film transistor on the passivation layer; forming a partition for partitioning the pixel region on the substrate formed with the pixel electrode; forming a white organic light emission layer on the substrate formed with the partition; and forming a common electrode on the organic light emission layer.

Here, the method may be characterized by further including performing a first curing process to remove outgas within the color filter subsequent to forming the color filter on a pixel region in which an image is displayed.

The method may be characterized in that the passivation layer is formed with a thickness of 1000-5000 Å using silicon nitride.

The method may be characterized by further including forming a plurality of holes for exposing the color filter by selectively removing the passivation layer at an upper portion of the color filter.

The method may be characterized in that the holes are formed within the pixel region or formed out of the pixel region such as an upper portion of a data line or gate line.

The method may be characterized by further including performing a second curing process for removing outgas that has still remained in the first curing process subsequent to forming a plurality of holes for exposing the color filter.

The method may be characterized in that the first and the second curing process are carried out for one hour at temperature of 230° C.

As described above, according to the present invention, there is provided a white organic light emitting diode display device and a method of fabricating the same to remove outgas generated from a color filter and a planarization layer in advance or effectively block the outgas, thereby preventing pixel shrinkage due to outgas. As a result, it may be possible to obtain an effect of securing the reliability of a white organic light emission layer.

Further, according to the present invention, there is provided a white organic light emitting diode display device and a method of fabricating the same to prevent an existing planarization layer from being served as a wave guide, thereby providing an effect of suppressing the generation of fine light beams in a non-emitting region to enhance color characteristics.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 7A through 7J are cross-sectional views sequentially illustrating a method of fabricating a white organic light emitting diode display device according to a first embodiment of the present invention as illustrated in FIG. 5;

FIGS. 11A through 11J are plan views sequentially illustrating a method of fabricating a white organic light emitting diode display device according to a second embodiment of the present invention as illustrated in FIG. 9;

FIGS. 13A through 13J are cross-sectional views sequentially illustrating a method of fabricating a white organic light emitting diode display device according to a third embodiment of the present invention as illustrated in FIG. 12.

DETAILED DESCRIPTION OF THE INVENTION

Hereinafter, a white organic light emitting diode display device according to the present invention and a method of fabricating the same will be described in detail with reference to the accompanying drawings.

Figure 1:
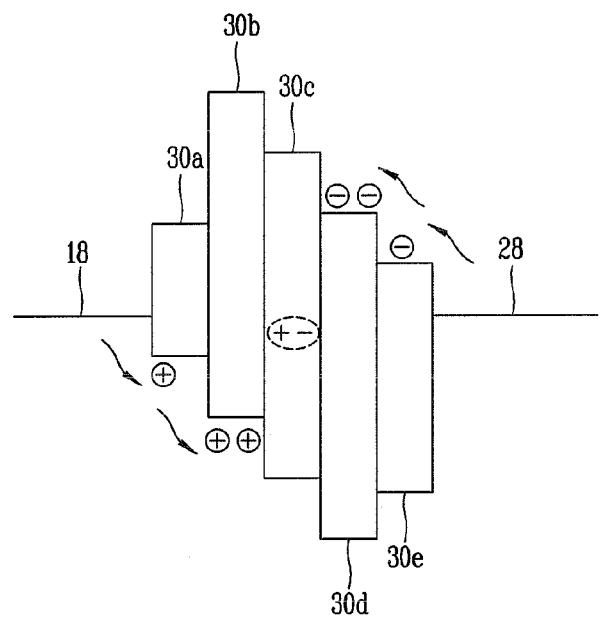
FIG. 1 is a diagram for explaining the light emitting principle of a typical organic light emitting diode display device.
Figure 2:
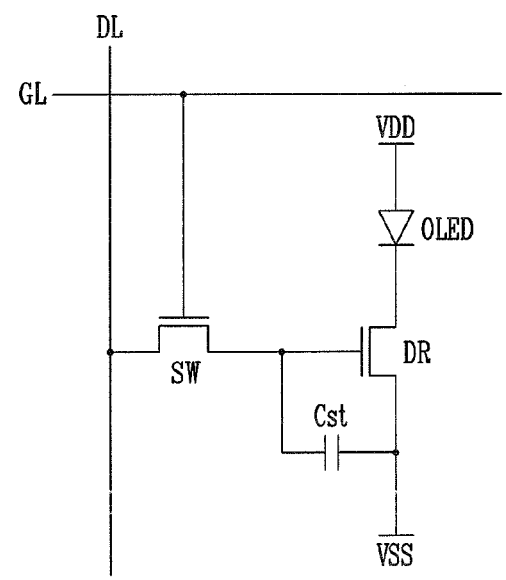
FIG. 2 is an equivalent circuit diagram for one pixel in a typical organic light emitting diode display device.
Figure 3:
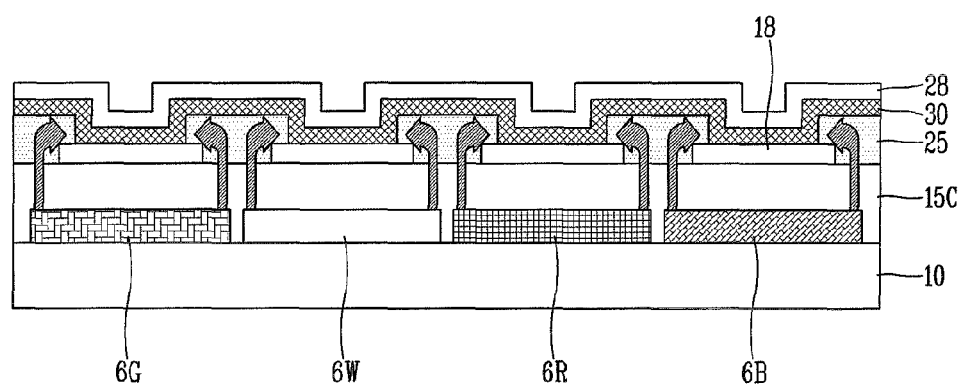
FIG. 3 is a cross-sectional view schematically illustrating the structure of a typical white organic light emitting diode display device.
Figure 4:
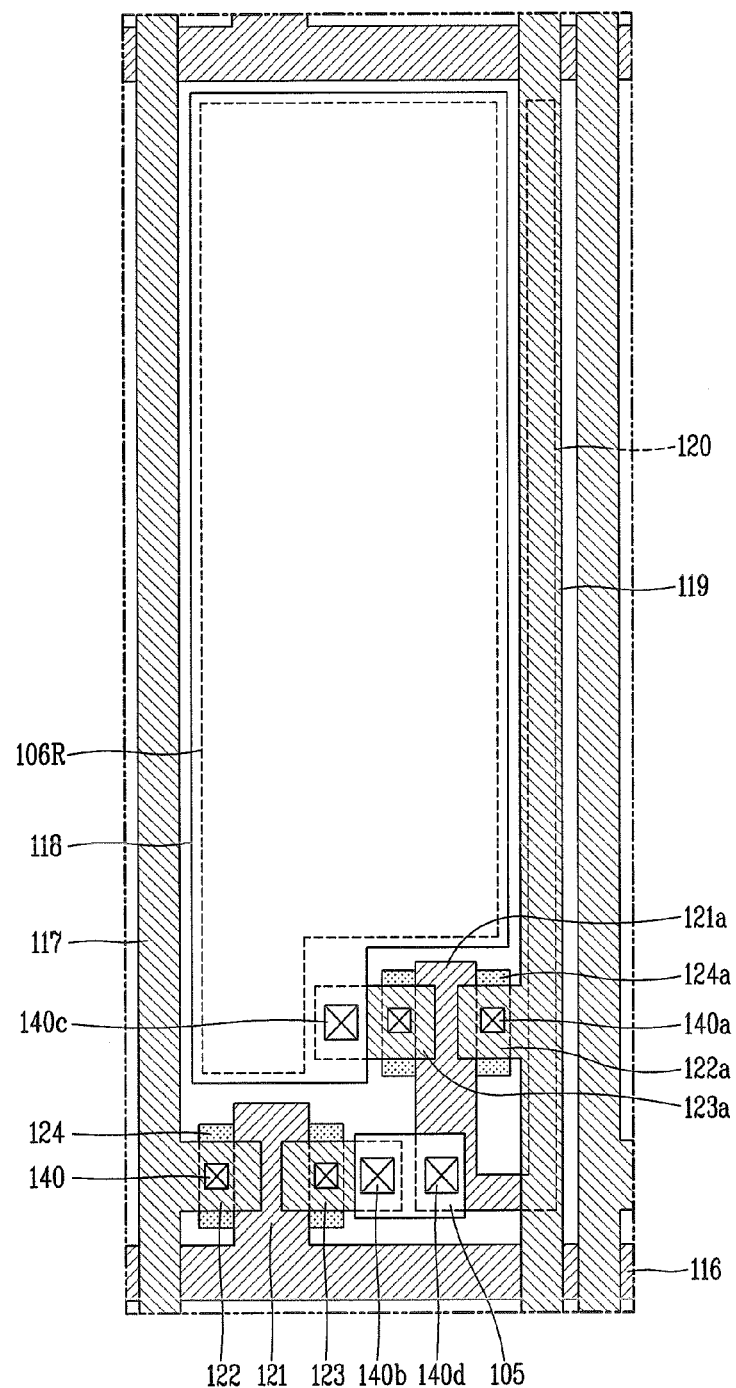
FIG. 4 is a plan view schematically illustrating the structure of a pixel in a white organic light emitting diode display device according to a first embodiment of the present invention.

FIG. 4 is a plan view schematically illustrating the structure of a pixel in a white organic light emitting diode (W-OLED) display device according to a first embodiment of the present invention, which illustrates the structure of a red sub-pixel, for example.

Here, FIG. 4 illustrates a sub-pixel of 2T1C including two transistors and one capacitor, for example, but the present invention will not be limited to this, and the present invention will be applicable regardless of the number of the transistors and capacitors.

Figure 5:
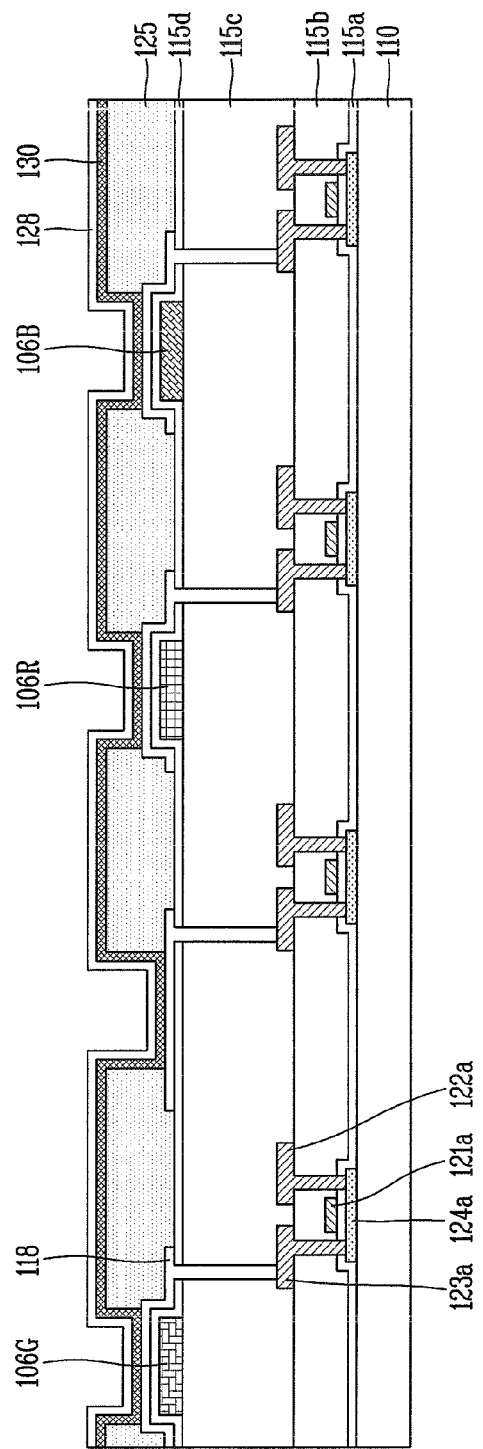
FIG. 5 is a cross-sectional view schematically illustrating the structure of a white organic light emitting diode display device according to a first embodiment of the present invention.

FIG. 5 is a cross-sectional view schematically illustrating the structure of a white organic light emitting diode (W-OLED) display device according to a first embodiment of the present invention, which illustrates one pixel of the W-OLED display device being operated in a bottom emission scheme. However, the present invention will not be applicable only to the bottom emission scheme, and also applicable to a top emission scheme.

In this case, an example is illustrated that the one pixel has a green sub-pixel, a white sub-pixel, a red sub-pixel, and a blue sub-pixel, but the present invention will not be limited to this.

As illustrated in the drawing, in a W-OLED display device according to a first embodiment of the present invention, a first active layer 124 and a second active layer 124a made of polycrystalline silicon may be formed on a substrate 110 made of an insulating material such as transparent glass or plastic.

In this case, according to a first embodiment of the present invention, an example is illustrated that a first active layer 124 and a second active layer 124a are made of polycrystalline silicon, but the present invention will not be limited to this, and the first active layer 124 and second active layer 124a may be also made of hydrogenated amorphous silicon or an oxide semiconductor.

A gate insulting layer 115a made of silicon nitride (SiNx) or silicon dioxide ($SiO_2$) may be formed on the substrate 110 including the first active layer 124 and second active layer 124a, and a gate line 116 including a first gate electrode 121 and a storage electrode 120 including a second gate electrode 121a may be formed thereon.

In this case, the first gate electrode 124 and second gate electrode 124a may be located at an upper portion of the first active layer 124 and second active layer 124a.

The gate line 116 may be extended in a horizontal direction to transmit a gate signal. In this case, the gate line 116 may include an end portion (not shown) having a large area to be connected to another layer or external driving circuit (not shown), and the first gate electrode 121 may be extended upward from the gate line 116. When a gate driving circuit for generating a gate signal is integrated on the substrate 110, the gate line 116 may be extended to be directly connected to the gate driving circuit.

The storage electrode 120 may be separated from the gate line 116, and extended long in a vertical direction and then the direction may be temporarily changed to the left side and extended upward to be connected to the second gate electrode 121a.

A first passivation layer 115b made of silicon nitride or silicon dioxide may be formed on the gate line 116 including the first gate electrode 121 and the storage electrode 120 including the second gate electrode 121a, and a data line 117, a driving voltage line 119, first source/drain electrodes 122, 123, and second source/drain electrodes 122a, 123a may be formed thereon.

The data line 117 for transferring a data signal may be extended in a vertical direction to be crossed with the gate line 116, defining a pixel region. In this case, the data line 117 may include a first source electrode 122 extending toward the first gate electrode 121 and an end portion (not shown) having a large area to be connected to another layer or external driving circuit (not shown). When a data driving circuit for generating a data signal is integrated on the substrate 110, the data line 117 may be extended to be directly connected to the data driving circuit.

The driving voltage line 119 for transferring a driving voltage may be extended in a vertical direction to be crossed with the gate line 116. In this case, the driving voltage line 119 may include a second source electrode 122a extending toward the second gate electrode 121a. The driving voltage line 119 may be overlapped with the storage electrode 120 to be connected to each other.

In this case, the first source electrode 122 and first drain electrode 123 may face each other at the center of the first gate electrode 121, and the second source electrode 122a and second drain electrode 123a may face each other at the center of the second gate electrode 121a.

Further, the first source/drain electrodes 122, 123 may be electrically connected to the source/drain regions of the first active layer 124 through the first contact hole 140, and the second source/drain electrodes 122a, 123a may be electrically connected to the source/drain regions of the second active layer 124a through the second contact hole 140a.

A second passivation layer 115c made of silicon nitride or silicon dioxide may be formed on the substrate 110 formed with the data line 117, driving voltage line 119, first source/drain electrodes 122, 123, and second source/drain electrodes 122a, 123a, and a red, green and blue color filter 106R, 106G, 106B may be formed in a pixel region thereon.

A third passivation layer 115d made of silicon nitride or silicon dioxide may be formed on a front surface of the substrate 110 formed with the red, green and blue color filter 106R, 106G, 106B.

In this case, according to a first embodiment of the present invention, silicon nitride having a low water vapor transmission rate (WVTR) may be used as the third passivation layer 115d to effectively block outgas generated from the color filter, thereby preventing pixel shrinkage due to outgas. As a result, it may be possible to obtain an effect of securing the reliability of a white organic light emission layer.

In other words, WVTR is $10^{-1}$ to $10^{-2}$ g/m$^2$/day when a single layer or bilayer is formed of photo acryl, polyvinyl alcohol (PVA) or parylene which is an organic insulating layer, but WVTR is $2 \times 10^{-3}$ g/m$^2$/day when silicon nitride which is an inorganic insulating layer is formed with a thickness of 1000 Å, thereby having an excellent water vapor permeability barrier effect. Accordingly, an outgas barrier effect may be also excellent when silicon nitride which is an inorganic insulating layer is applied.

Further, in a W-OLED display device according to a first embodiment of the present invention, a third passivation layer 115d having a thickness of 1000-5000 Å may be formed by using silicon nitride, instead of a planarization layer having a thickness of 2-3 μm in the prior art, thereby suppressing the generation of fine light beams in a non-emitting region to enhance color characteristics.

In this case, a third contact hole 140b and a fourth contact hole 140c for exposing the first drain electrode 123 and second drain electrode 123a, respectively, may be formed on the third passivation layer 115d and second passivation layer 115c, and a fifth contact hole 140d for exposing the second gate electrode 121a may be formed on the third passivation layer 115d, second passivation layer 115c, and first passivation layer 115b.

Further, a pixel electrode 118 and a connecting electrode 105 may be formed on the third passivation layer 115d. They may be made of a transparent conductive material such as indium tin oxide (ITO) or indium zinc oxide (IZO) or reflective conductive material such as aluminium, silver or their alloy.

In this case, the pixel electrode 118 which is an anode may be electrically connected to the second drain electrode 123a through the fourth contact hole 140c whereas the connecting electrode 105 is electrically connected between the first drain electrode 123 and second gate electrode 121a through the third contact hole 140b and fifth contact hole 140d.

A partition 125 may be formed on the substrate 110 formed with the pixel electrode 118. In this case, the partition 125 may surround a circumferential edge of the pixel electrode 118 like a bank to define an opening, and may be made of an organic insulating material or inorganic insulating material. The partition 125 may be also made of a photo resist including a black pigment, and in this case the partition 125 may perform the role of a light blocking member.

A white organic light emission layer 130 may be formed on the substrate 110 formed with the partition 125.

A common electrode 128 which is a cathode may be formed on the organic light emission layer 130. In this case, a common voltage may be applied to the common electrode 128, and may be made of a reflective conductive material including calcium (Ca), barium (Ba), magnesium (Mg), aluminium, silver and the like or a transparent conductive material such as indium tin oxide (ITO), indium zinc oxide (IZO) and the like.

In a W-OLED display device having the foregoing configuration, the first gate electrode 121 connected to the gate line 116 and the first source electrode 122 and first drain electrode 123 connected to the data line 117 together with the first active layer 124 may form a switching thin-film transistor (TFT). In addition, the second gate electrode 121a connected to the first drain electrode 123, the source electrode 122a connected to the driving voltage line 119, and the second drain electrode 123a connected to the pixel electrode 118 together with the second active layer 124a may form a driving thin-film transistor (TFT).

Further, the pixel electrode 118, organic light emission layer 130 and common electrode 128 may form an organic light emitting diode, and the storage electrode 120 and driving voltage line 119 overlapped with each other may form a storage capacitor.

Hereinafter, a method of fabricating a W-OLED display device according to a first embodiment of the present invention will be described in detail with reference to the accompanying drawings.

FIGS. 6A through 6G are plan views sequentially illustrating a method of fabricating a white organic light emitting diode display device according to a first embodiment of the present invention as illustrated in FIG. 4.

FIGS. 7A through 7J are cross-sectional views sequentially illustrating a method of fabricating a white organic light emitting diode display device according to a first embodiment of the present invention as illustrated in FIG. 5, which illustrate a method of fabricating a pixel including a driving thin-film transistor for the sake of brevity of explanation.

Figure 6A:
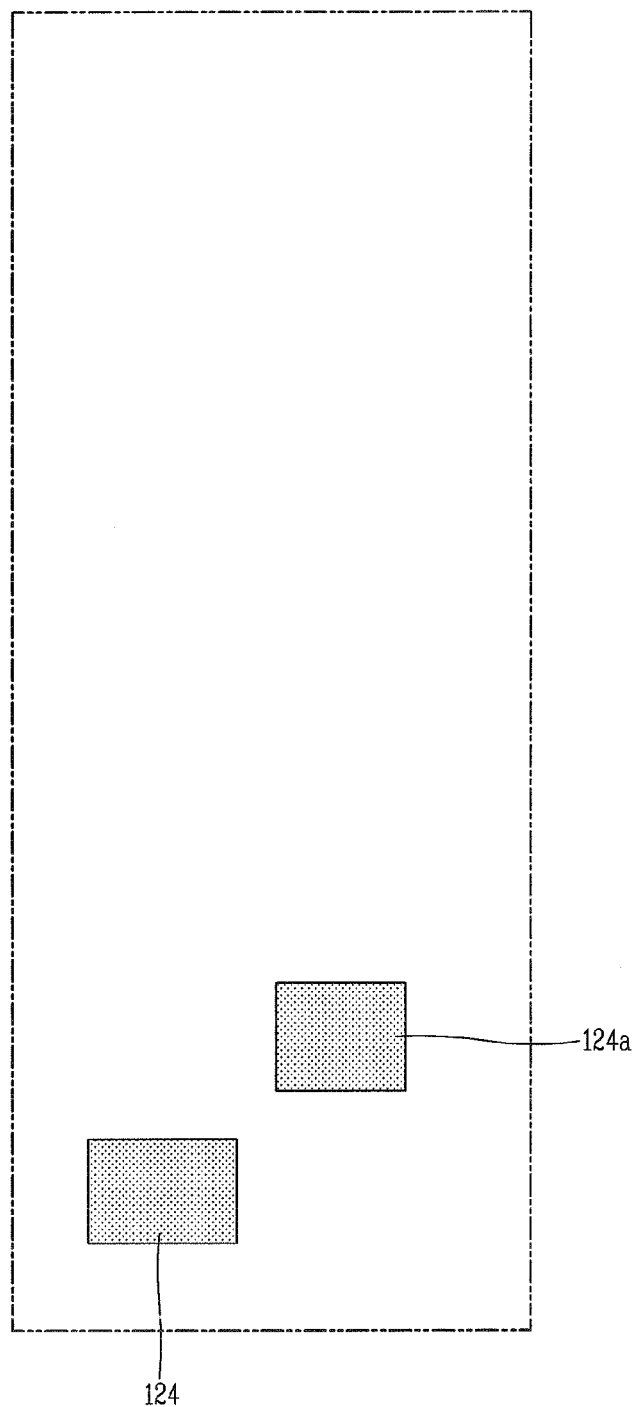
FIGS. 6A through 6G are plan views sequentially illustrating a method of fabricating a white organic light emitting diode display device according to a first embodiment of the present invention as illustrated in FIG. 4.
Figure 7A:
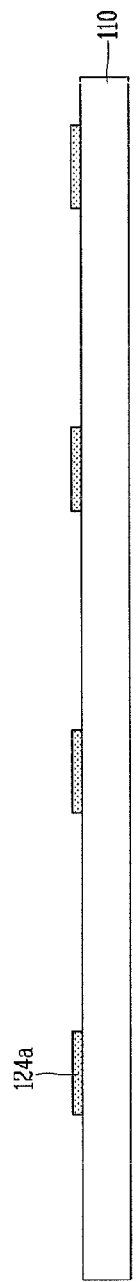

As illustrated in FIGS. 6A and 7A, a buffer layer (not shown) and a silicon layer may be formed on the substrate 110 made of an insulating material such as transparent glass, plastic or the like.

In this case, the buffer layer may perform the role of a blocking impurities such as sodium (Na) from being infiltrated into an upper layer during the process.

The silicon layer may be formed of amorphous silicon or polycrystalline silicon, but according to the first embodiment an example is illustrated that a thin-film transistor is formed by using polycrystalline silicon. In this case, the polycrystalline silicon may be formed by using various crystallization methods subsequent to depositing amorphous silicon on the substrate 110.

In this case, as described above, according to a first embodiment of the present invention, an example is illustrated that the first active layer 124 and second active layer 124a are formed of polycrystalline silicon, but the present invention will not be limited to this, the first active layer 124 and second active layer 124a may be also made of hydrogenated amorphous silicon or an oxide semiconductor.

Figure 6B:
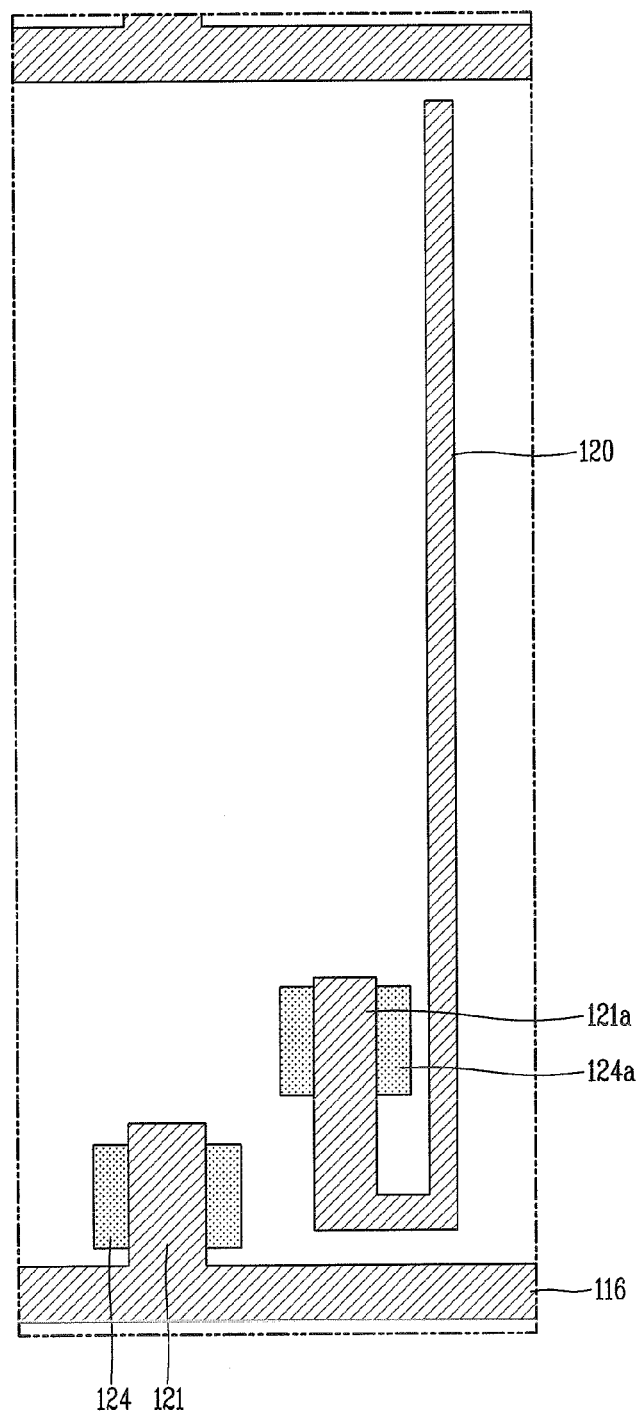
Figure 7B:
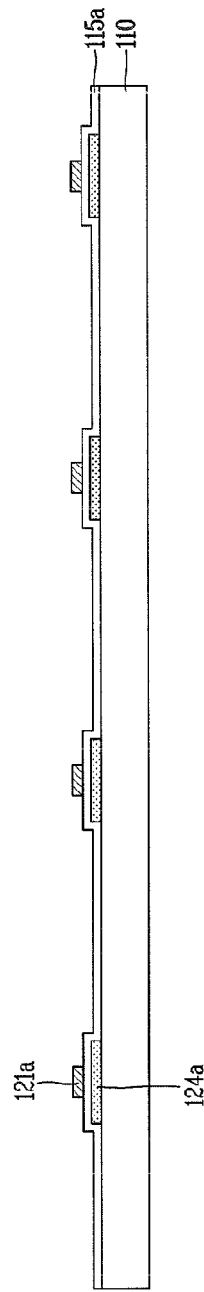

Next, as illustrated in FIGS. 6B and 7B, a gate insulating layer 115a made of silicon nitride or silicon dioxide may be formed on the substrate 110 formed with the first active layer 124 and second active layer 124a, and the gate line 116 including the first gate electrode 121 and the storage electrode 120 including the second gate electrode 121a may be formed thereon.

In this case, the gate line 116 including the first gate electrode 121 and the storage electrode 120 including the second gate electrode 121a may be formed by depositing a first conductive layer on a front surface of the substrate 110 and then selectively patterning the conductive layer through a photolithography process.

Figure 6C:
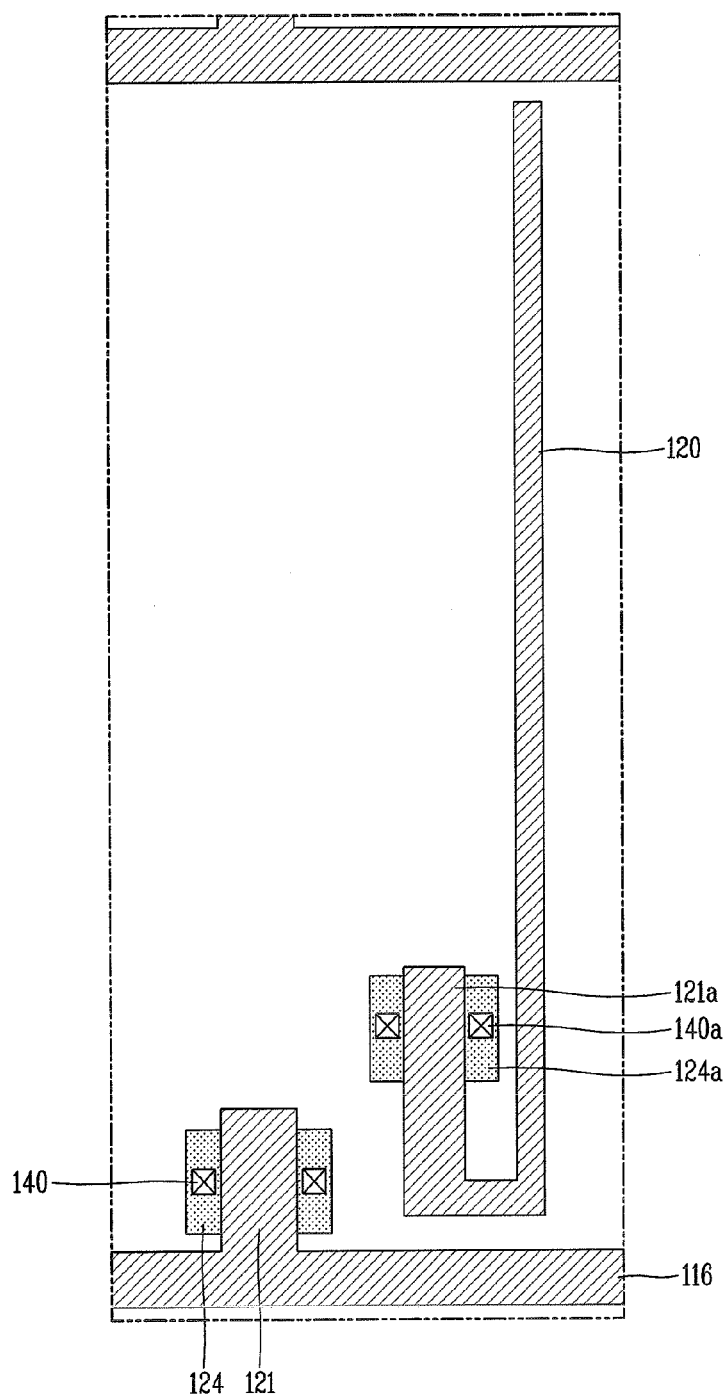
Figure 7C:
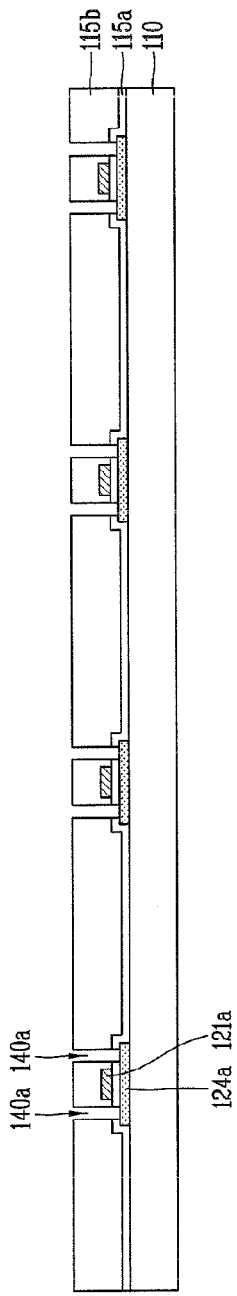

Next, as illustrated in FIGS. 6C and 7C, a first passivation layer 115b made of silicon nitride or silicon dioxide may be formed on a front surface of the substrate 110 formed with the gate line 116 including the first gate electrode 121 and the storage electrode 120 including the second gate electrode 121a and then the first passivation layer 115b and gate insulating layer 115a may be selectively patterned through the photolithography process to form a first contact hole 140 for exposing the source/drain regions of the first active layer 124 and a second contact hole 140a for exposing the source/drain regions of the second active layer 124a.

Figure 6D:
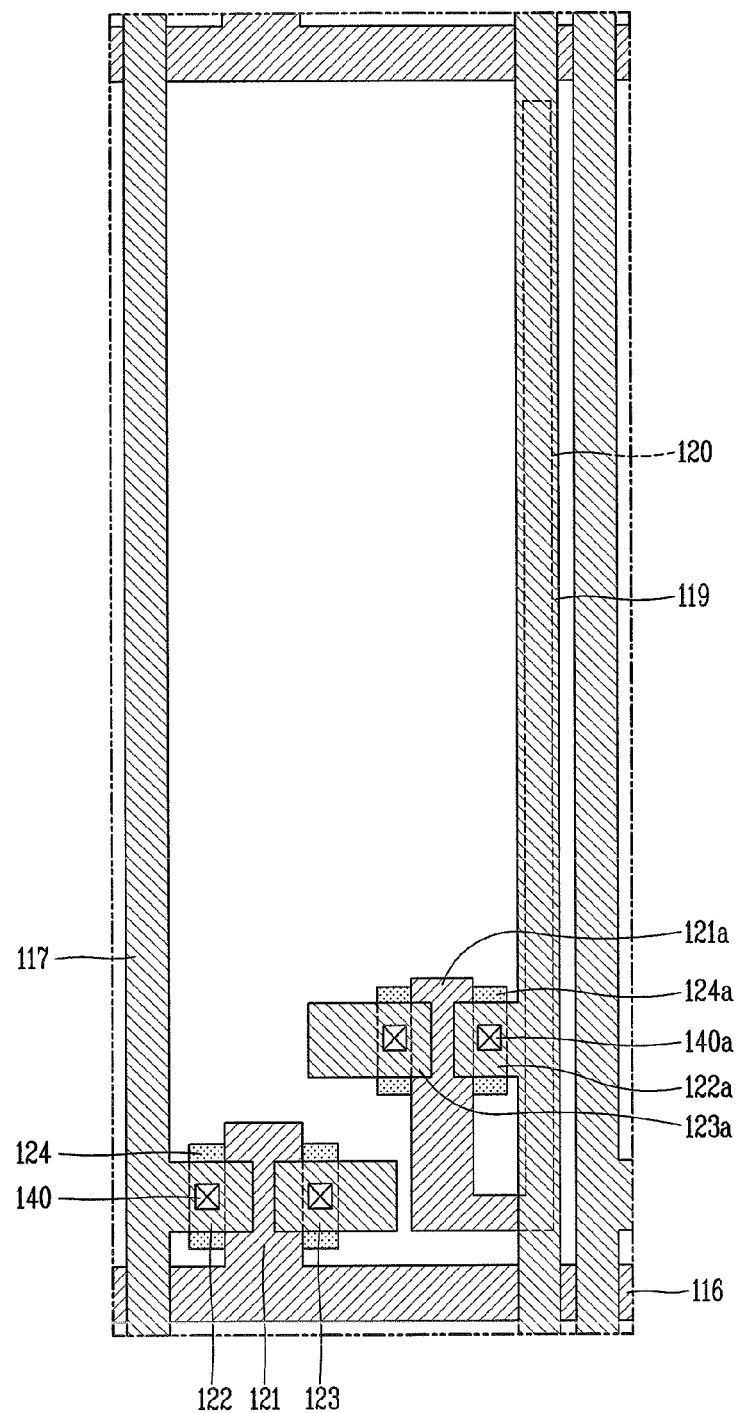
Figure 7D:
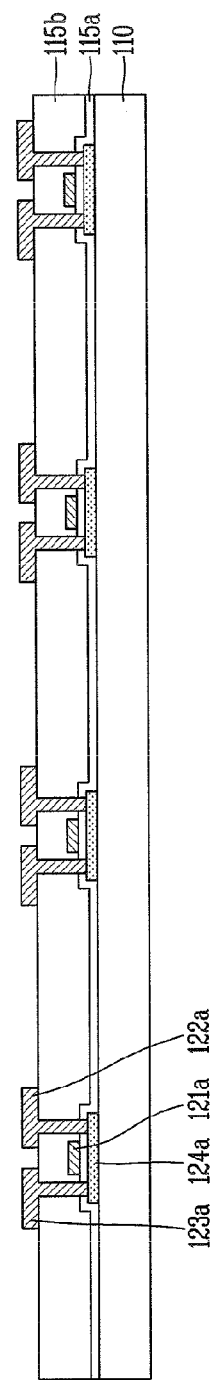

Then, as illustrated in FIGS. 6D and 7D, a second conductive layer may be formed on a front surface of the substrate 110 formed with the first passivation layer 115b, and then the second conductive layer may be selectively removed through the photolithography process to form a data line 117, a driving voltage line 119, first source/drain electrodes 122, 123, and second source/drain electrodes 122a, 123a which are made of the second conductive layer.

In this case, the first source/drain electrodes 122, 123 may be electrically connected to the source/drain regions of the first active layer 124 through the first contact hole 140 whereas the second source/drain electrodes 122a, 123a may be electrically connected to the source/drain regions of the second active layer 124a through the second contact hole 140a.

Figure 6E:
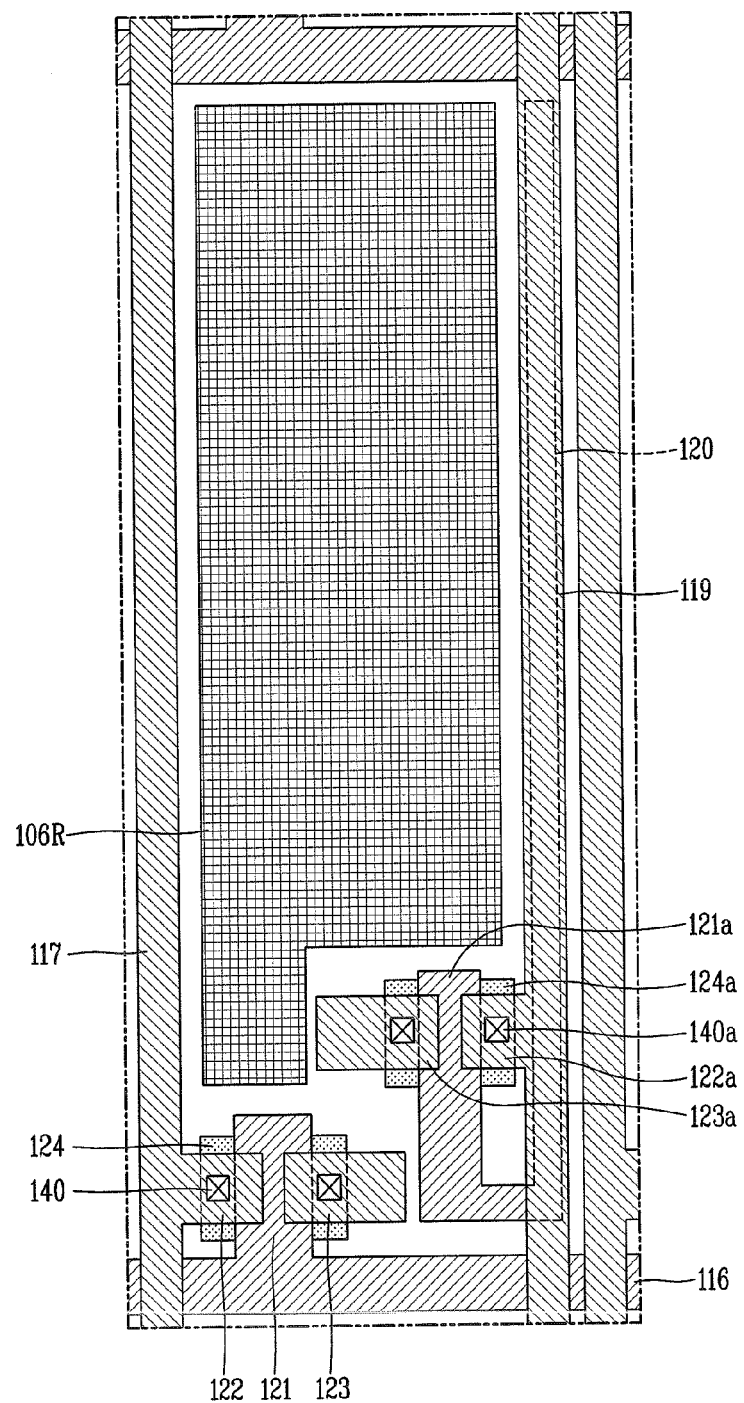
Figure 7E:
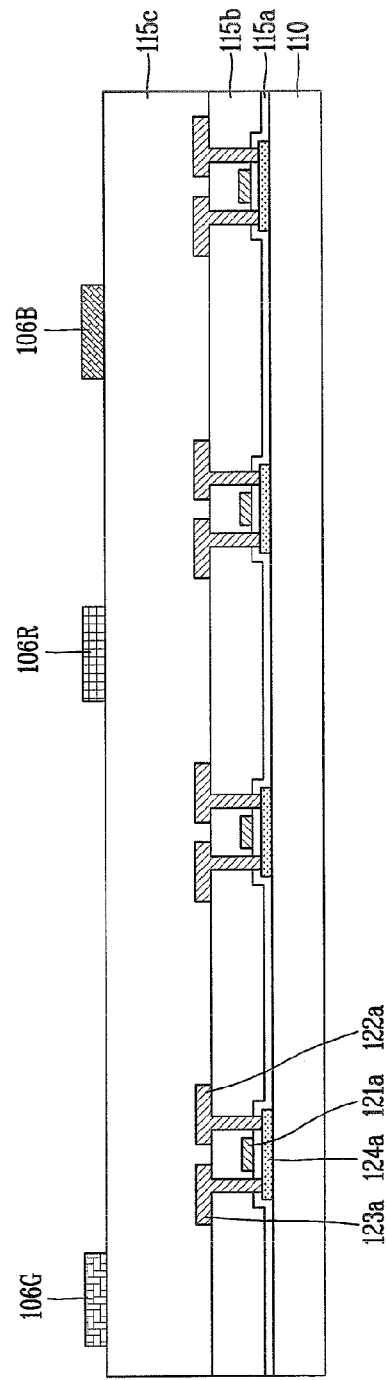

Next, as illustrated in FIGS. 6E and 7E, a second passivation layer 115c made of silicon nitride or silicon dioxide may be formed on a front surface of the substrate 110 formed with the data line 117, driving voltage line 119, first source/drain electrodes 122, 123, and second source/drain electrodes 122a, 123a, and then a red, green and blue color filter 106R, 106G, 106B may be formed in a pixel region thereon.

Figure 6F:
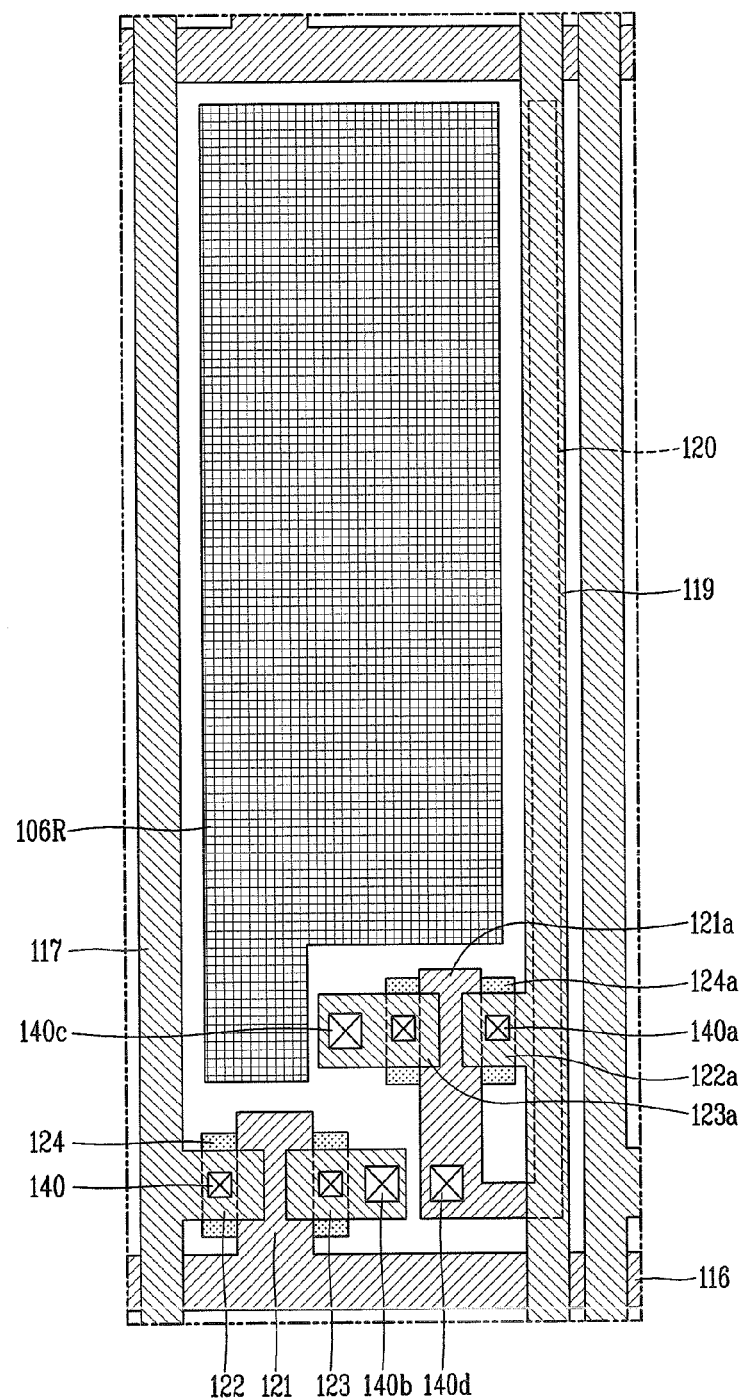
Figure 7F:
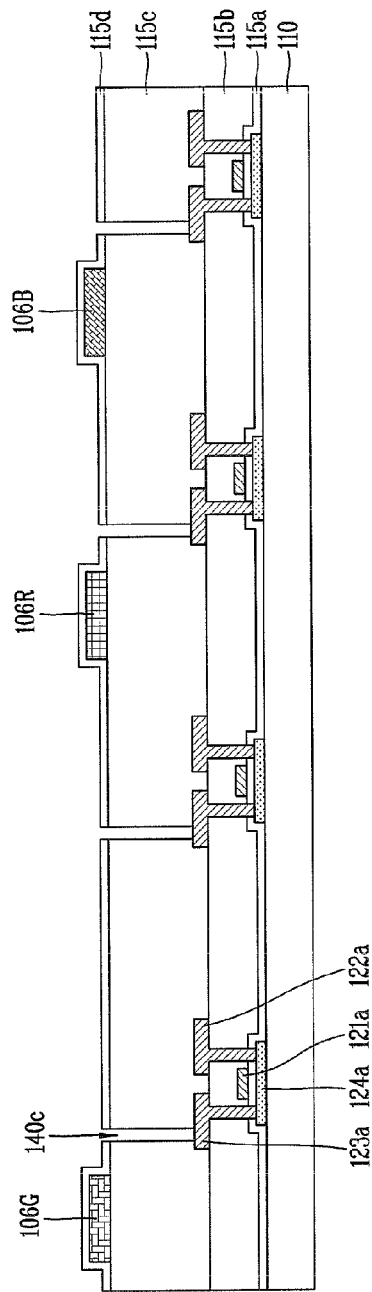

Next, as illustrated in FIGS. 6F and 7F, a third passivation layer 115d made of silicon nitride or silicon dioxide may be formed on a front surface of the substrate 110 formed with the red, green and blue color filter 106R, 106G, 106B.

In this case, as described above, according to a first embodiment of the present invention, silicon nitride having a low WVTR may be used as the third passivation layer 115d to effectively block outgas generated from the color filter, thereby preventing pixel shrinkage due to outgas. As a result, it may be possible to obtain an effect of securing the reliability of a white organic light emission layer.

In other words, WVTR is $10^{-1}$ to $10^{-2}$ g/m$^2$/day when a single layer or bilayer is formed of photo acryl, polyvinyl alcohol (PVA) or parylene which is an organic insulating layer, but WVTR is $2\times10^{-3}$ g/m$^2$/day when silicon nitride which is an inorganic insulating layer is formed with a thickness of 1000 Å, thereby having an excellent water vapor permeability barrier effect. Accordingly, an outgas barrier effect may be also excellent when silicon nitride which is an inorganic insulating layer is applied.

Further, in a W-OLED display device according to a first embodiment of the present invention, a third passivation layer 115d having a thickness of 1000-5000 Å may be formed by using silicon nitride, instead of a planarization layer having a thickness of 2-3 μm in the prior art, thereby suppressing the generation of fine light beams in a non-emitting region to enhance color characteristics.

Subsequently, the third passivation layer 115d and second passivation layer 115c may be selectively removed through a photolithography process to form a third contact hole 140b and a fourth contact hole 140c for exposing the first drain electrode 123 and second drain electrode 123a, respectively, whereas the third passivation layer 115d, second passivation layer 115c, and first passivation layer 115b may be selectively removed to form a fifth contact hole 140d for exposing the second gate electrode 121a.

Figure 6G:
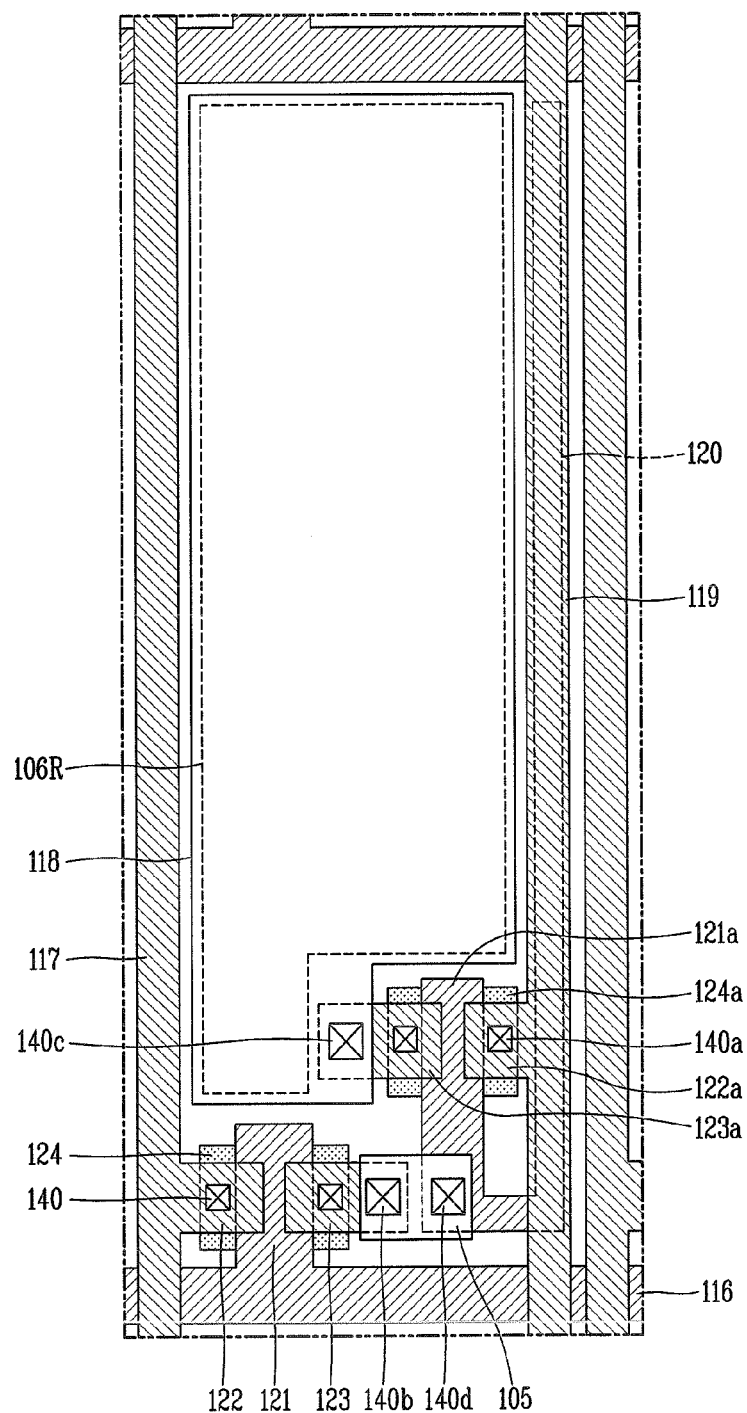
Figure 7G:
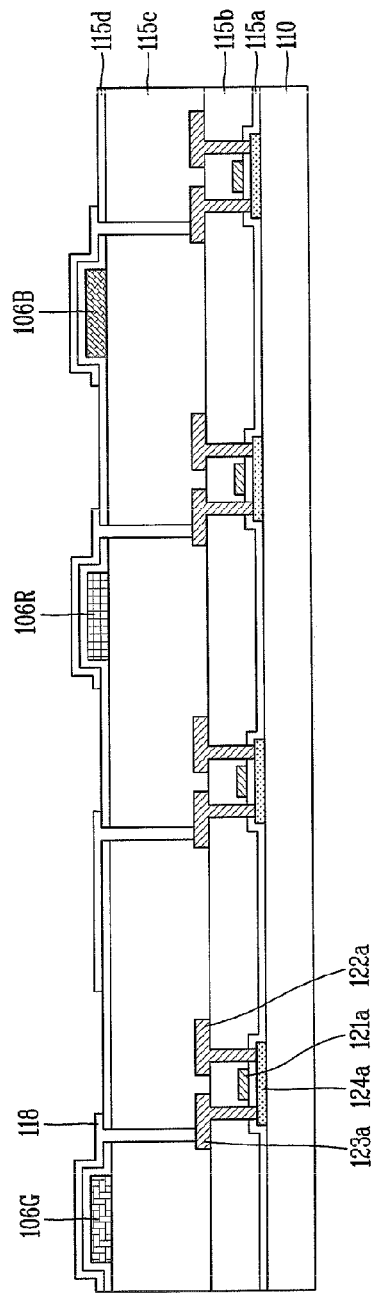

Then, as illustrated in FIGS. 6G and 7G, a third conductive layer may be formed on a front surface of the substrate 110 formed with the third passivation layer 115d, and then the third conductive layer may be selectively removed to form a pixel electrode 118 and a connecting electrode 105 made of the third conductive layer.

In this case, the third conductive layer may be made of a transparent conductive material such as ITO, IZO and the like.

Also, the pixel electrode 118 which is an anode may be electrically connected to the second drain electrode 123a through the fourth contact hole 140c whereas the connecting electrode 105 is electrically connected between the first drain electrode 123 and second gate electrode 121a through the third contact hole 140b and fifth contact hole 140d.

Next, as illustrated in FIG. 7H, a partition 125 for partitioning between sub-pixels may be formed on the substrate 110 formed with the pixel electrode 118 and connecting electrode 105.

Here, the partition 125 may surround a circumferential edge of the pixel electrode 118 like a bank to define an opening, and may be made of an organic insulating material or inorganic insulating material. The partition 125 may be also made of a photo resist including a black pigment, and in this case the partition 125 may perform the role of a light blocking member.

Then, as illustrated in FIG. 7I, a white organic light emission layer 130 may be formed on the substrate 110 formed with the partition 125.

Figure 7J:
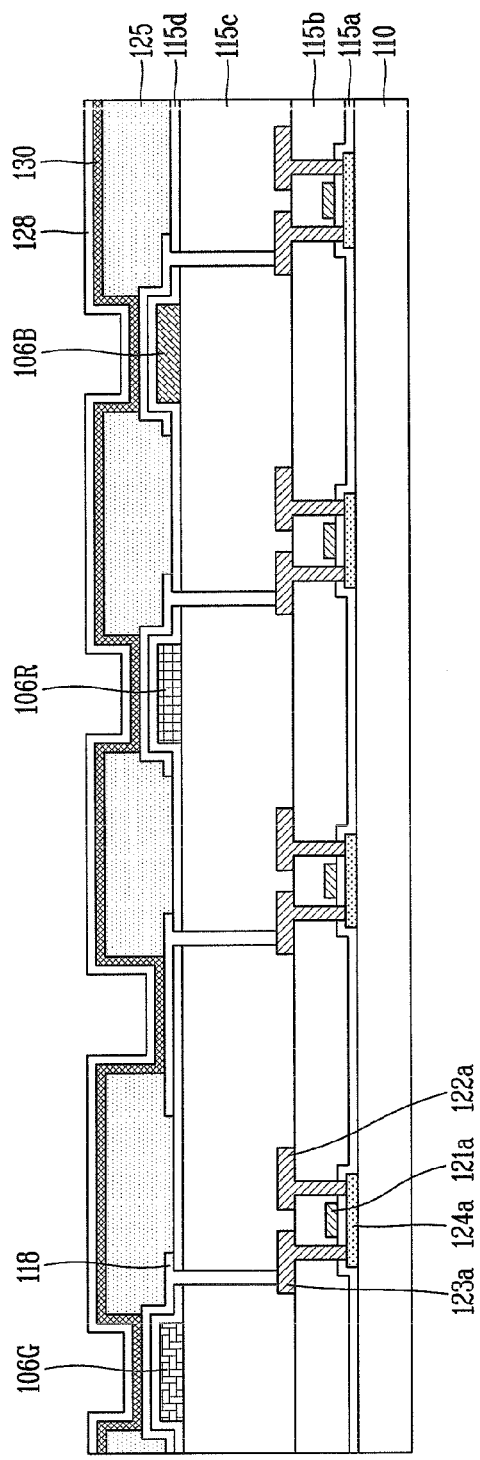

Next, as illustrated in FIG. 7J, a common electrode 128 which is a cathode may be formed on the organic light emission layer 130.

In this case, a common voltage may be applied to the common electrode 128, and may be made of a reflective conductive material including calcium, barium, magnesium, aluminium, silver and the like or a transparent conductive material such as ITO, IZO and the like.

As described above, in a W-OLED display device according to a first embodiment of the present invention, silicon nitride having a low water vapor transmission rate may be used as a third passivation layer, instead of a planarization layer which is an organic insulating layer, thereby effectively blocking outgas generated from the color filter. As a result, when holes are formed on the third passivation layer to remove the outgas in advance, the reliability may be further enhanced, and it will be described in detail through a second embodiment of the present invention.

Figure 8:
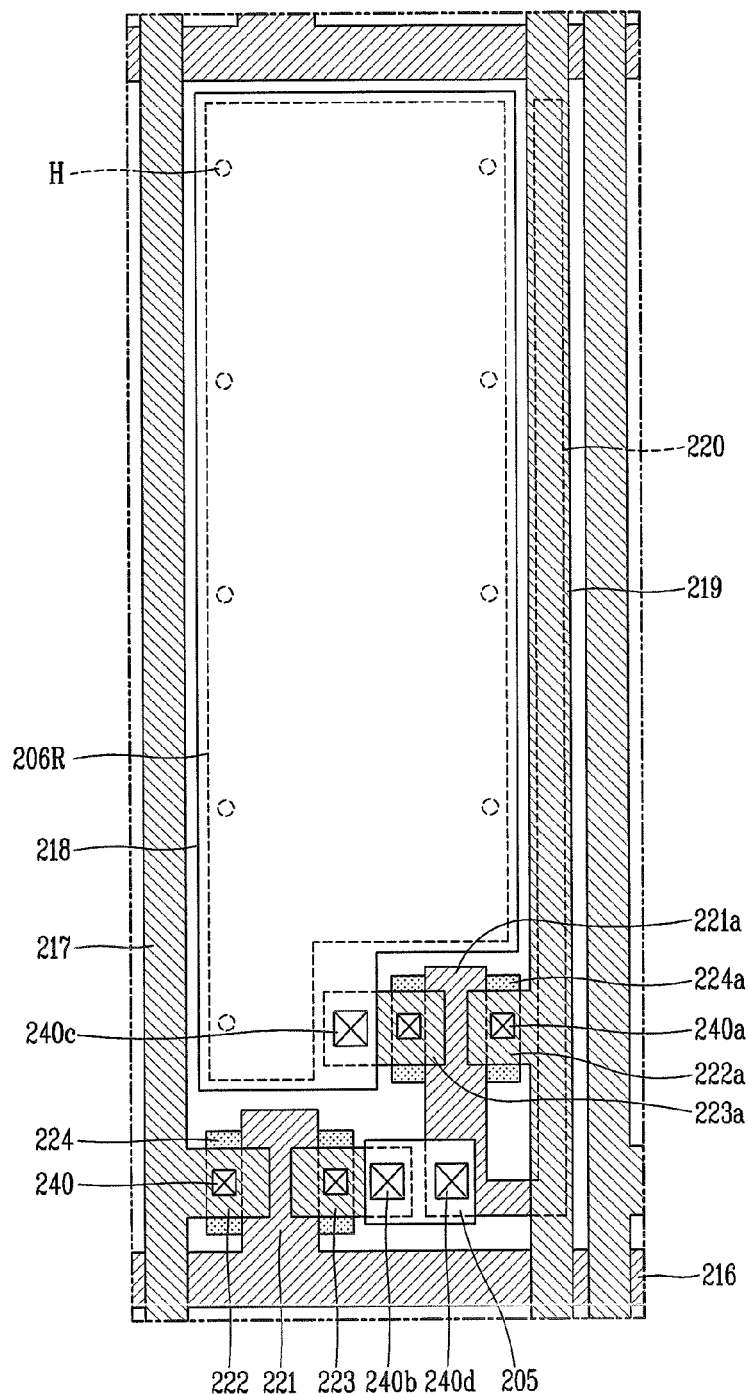
FIG. 8 is a plan view schematically illustrating the structure of a pixel in a white organic light emitting diode display device according to a second embodiment of the present invention.

FIG. 8 is a plan view schematically illustrating the structure of a pixel in a white organic light emitting diode display device according to a second embodiment of the present invention, which illustrates the structure of a red sub-pixel.

Figure 9:
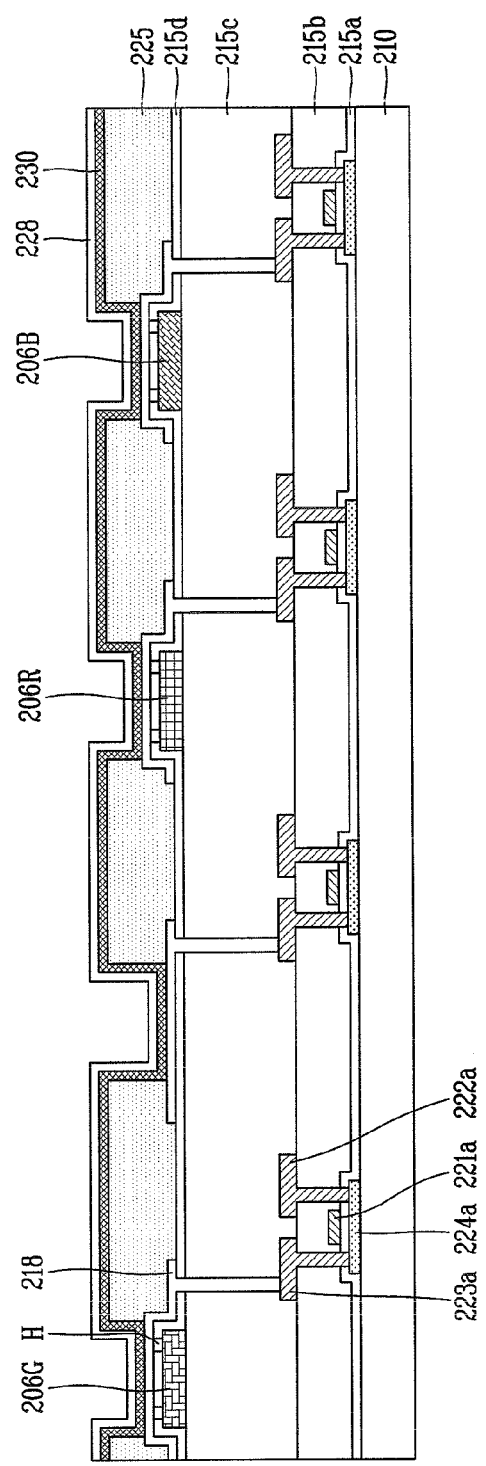
FIG. 9 is a cross-sectional view schematically illustrating the structure of a white organic light emitting diode display device according to a second embodiment of the present invention.

FIG. 9 is a cross-sectional view schematically illustrating the structure of a white organic light emitting diode display device according to a second embodiment of the present invention, which illustrates one pixel in a W-OLED display device being operated in a bottom emission scheme. However, the present invention will not be applicable only to the bottom emission scheme, and also applicable to a top emission scheme.

In this case, a W-OLED display device according to a second embodiment of the present invention may include substantially same elements as the foregoing W-OLED display device according to a first embodiment of the present invention other than the configuration of forming holes on the third passivation layer to effectively block outgas. Accordingly, some description of the substantially same elements will be omitted.

As illustrated in the drawings, in a W-OLED display device according to a second embodiment of the present invention, a first active layer 224 and a second active layer 224a made of polycrystalline silicon may be formed on a substrate 210 made of an insulating material such as transparent glass or plastic.

A gate insluting layer 215a made of silicon nitride or silicon dioxide may be formed on the substrate 210 including the first active layer 224 and second active layer 224a, and a gate line 216 including a first gate electrode 221 and a storage electrode 220 including a second gate electrode 221a may be formed thereon.

A first passivation layer 215b made of silicon nitride or silicon dioxide may be formed on the gate line 216 including the first gate electrode 221 and the storage electrode 220 including the second gate electrode 221a, and a data line 217, a driving voltage line 219, first source/drain electrodes 222, 223, and second source/drain electrodes 222a, 223a are formed thereon.

The first source/drain electrodes 222, 223 may be electrically connected to the source/drain regions of the first active layer 224 through the first contact hole 240, and the second source/drain electrodes 222a, 223a may be electrically connected to the source/drain regions of the second active layer 224a through the second contact hole 240a.

A second passivation layer 215c made of silicon nitride or silicon dioxide may be formed on the substrate 210 formed with the data line 217, driving voltage line 219, first source/drain electrodes 222, 223, and second source/drain electrodes 222a, 223a, and a red, green and blue color filter 206R, 206G, 206B may be formed in a pixel region thereon.

A third passivation layer 215d made of silicon nitride or silicon dioxide may be formed on a front surface of the substrate 210 formed with the red, green and blue color filter 206R, 206G, 206B.

In this case, according to a second embodiment of the present invention, silicon nitride having a low water vapor transmission rate (WVTR) may be used as the third passivation layer 215d, similarly to the foregoing first embodiment, to effectively block outgas generated from the color filter, thereby preventing pixel shrinkage due to outgas. As a result, it may be possible to obtain an effect of securing the reliability of a white organic light emission layer.

Further, in a W-OLED display device according to a second embodiment of the present invention, a third passivation layer 215d having a thickness of 1000-5000 Å may be formed by using silicon nitride, instead of a planarization layer having a thickness of 2-3 μm in the prior art, thereby suppressing the generation of fine light beams in a non-emitting region to enhance color characteristics.

In particular, in a W-OLED display device according to a second embodiment of the present invention, a plurality of holes (H) may be formed on the third passivation layer 215d at an upper circumferential portion of the red, green and blue color filter 206R, 206G, 206B, thereby removing outgas within the red, green and blue color filter 206R, 206G, 206B in advance through the holes (H) using a predetermined curing process. In this case, the curing process may be carried out for about one hour at temperature of 230° C., but the present invention will not be limited to this. The holes (H) may be also formed out of a pixel region such as an upper portion of the data line 217 or gate line 216.

In this case, a third contact hole 240b and a fourth contact hole 240c for exposing the first drain electrode 223 and second drain electrode 223a, respectively, may be formed on the third passivation layer 215d and second passivation layer 215c, and a fifth contact hole 240d for exposing the second gate electrode 221a may be formed on the third passivation layer 215d, second passivation layer 215c, and first passivation layer 215b.

Further, a pixel electrode 218 and a connecting electrode 205 may be formed on the third passivation layer 215d.

In this case, the pixel electrode 218 which is an anode may be electrically connected to the second drain electrode 223a through the fourth contact hole 240c whereas the connecting electrode 205 is electrically connected between the first drain electrode 223 and second gate electrode 221a through the third contact hole 240b and fifth contact hole 240d.

A partition 225 may be formed on the substrate 210 formed with the pixel electrode 218. A white organic light emission layer 230 may be formed on the substrate 210 formed with the partition 225.

A common electrode 228 which is a cathode may be formed on the organic light emission layer 230. In a W-OLED display device having the foregoing configuration, the first gate electrode 221 connected to the gate line 216 and the first source electrode 222 and first drain electrode 223 connected to the data line 217 together with the first active layer 224 may form a switching thin-film transistor. In addition, the second gate electrode 221a connected to the first drain electrode 223, the source electrode 222a connected to the driving voltage line 219, and the second drain electrode 223a connected to the pixel electrode 218 together with the second active layer 224a may form a driving thin-film transistor.

Further, the pixel electrode 218, organic light emission layer 230 and common electrode 228 may form an organic light emitting diode, and the storage electrode 220 and driving voltage line 219 overlapped with each other may form a storage capacitor.

Hereinafter, a method of fabricating a W-OLED display device according to a second embodiment of the present invention will be described in detail with reference to the accompanying drawings.

FIGS. 10A through 10G are plan views sequentially illustrating a method of fabricating a white organic light emitting diode display device according to a second embodiment of the present invention as illustrated in FIG. 8.

FIGS. 11A through 11J are cross-sectional views sequentially illustrating a method of fabricating a white organic light emitting diode display device according to a second embodiment of the present invention as illustrated in FIG. 9, which illustrate a method of fabricating a pixel including a driving thin-film transistor for the sake of brevity of explanation.

Figure 10A:
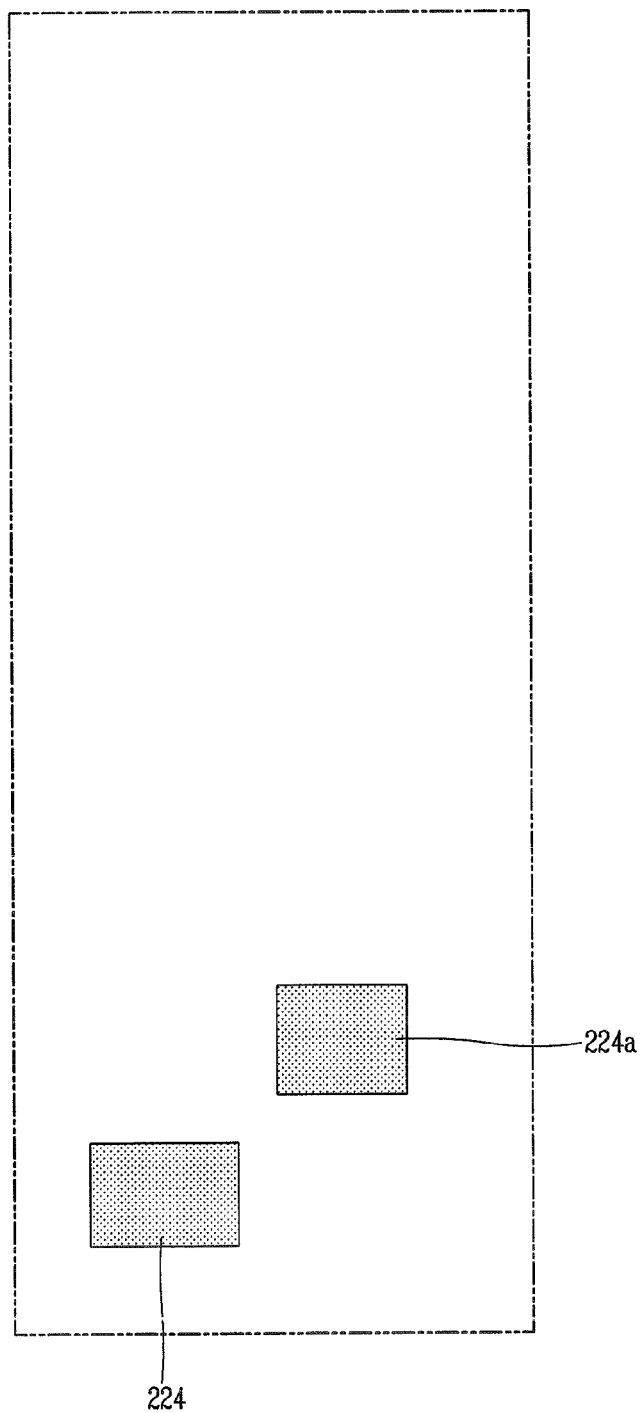
FIGS. 10A through 10G are plan views sequentially illustrating a method of fabricating a white organic light emitting diode display device according to a second embodiment of the present invention as illustrated in FIG. 8.
Figure 11A:
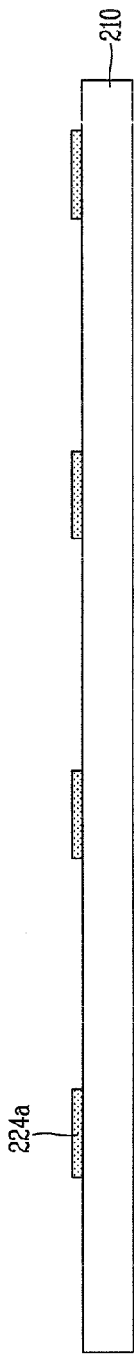

As illustrated in FIGS. 10A and 11A, a buffer layer (not shown) and a silicon layer may be formed on the substrate 210 made of an insulating material such as transparent glass, plastic or the like.

The silicon layer may be formed of amorphous silicon or polycrystalline silicon, but according to the second embodiment an example is illustrated that a thin-film transistor is formed by using polycrystalline silicon.

Subsequently, the silicon layer may be selectively removed through a photolithography process to form a first active layer 224 and a second first active layer 224a made of the polycrystalline silicon.

Figure 10B:
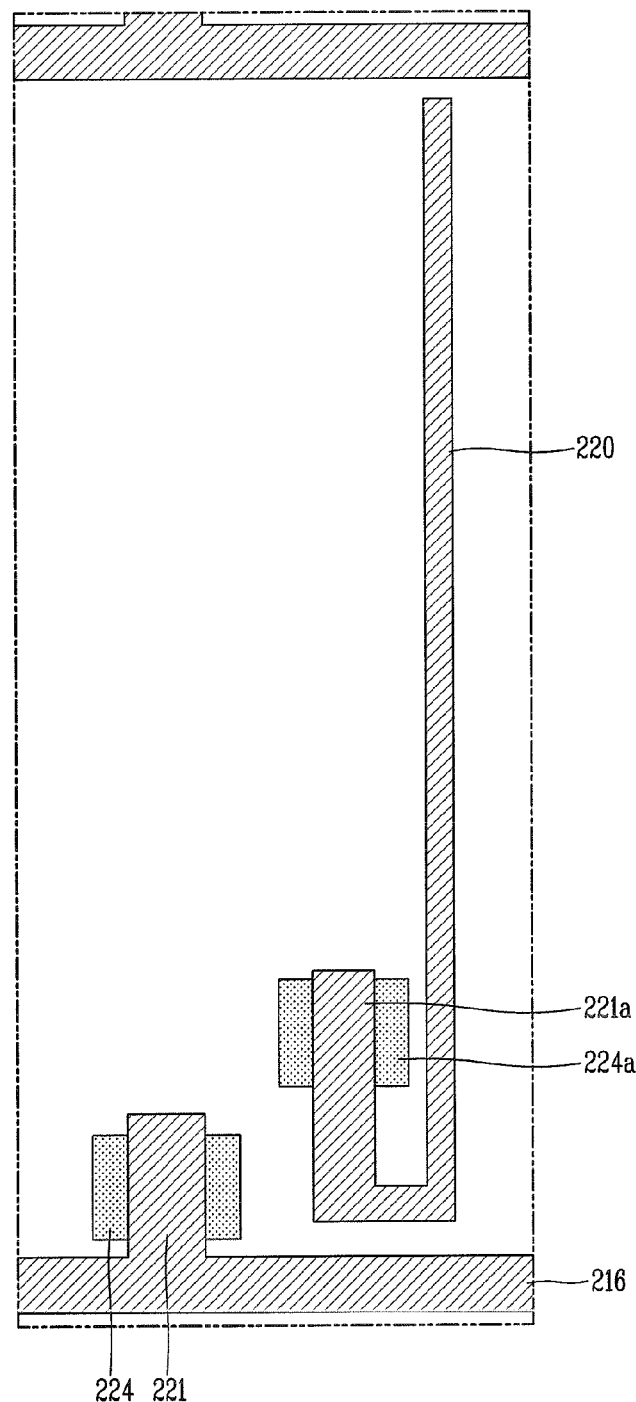
Figure 11B:
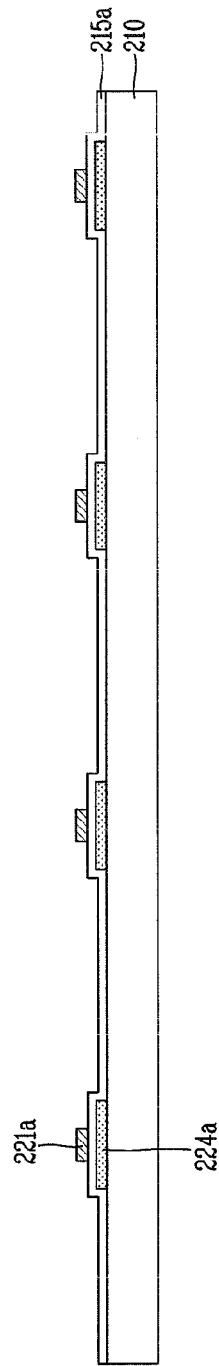

Next, as illustrated in FIGS. 10B and 11B, a gate insulating layer 215a made of silicon nitride or silicon dioxide may be formed on the substrate 210 formed with the first active layer 224 and second active layer 224a, and the gate line 216 including the first gate electrode 221 and the storage electrode 220 including the second gate electrode 221a may be formed thereon.

In this case, the gate line 216 including the first gate electrode 221 and the storage electrode 220 including the second gate electrode 221a may be formed by depositing a first conductive layer on a front surface of the substrate 210 and then selectively patterning the conductive layer through a photolithography process.

Figure 10C:
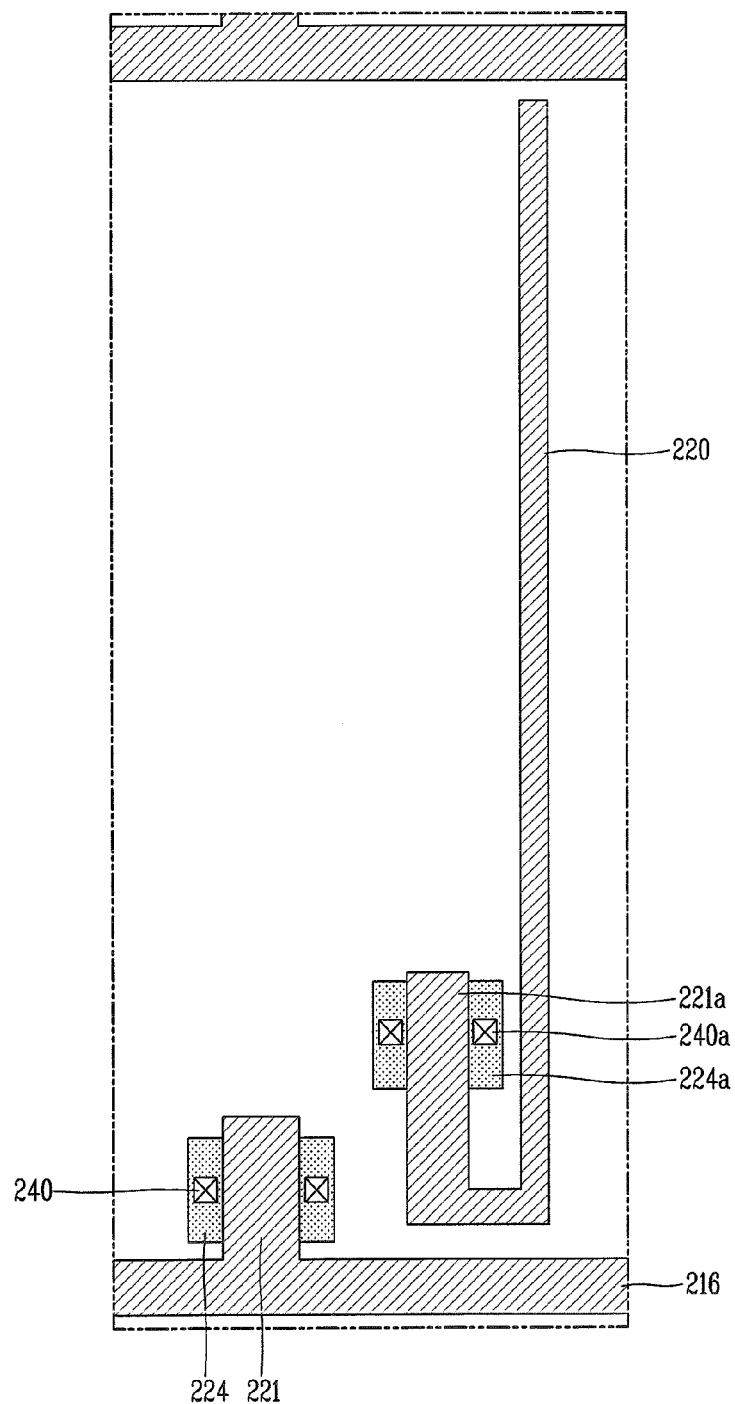
Figure 11C:
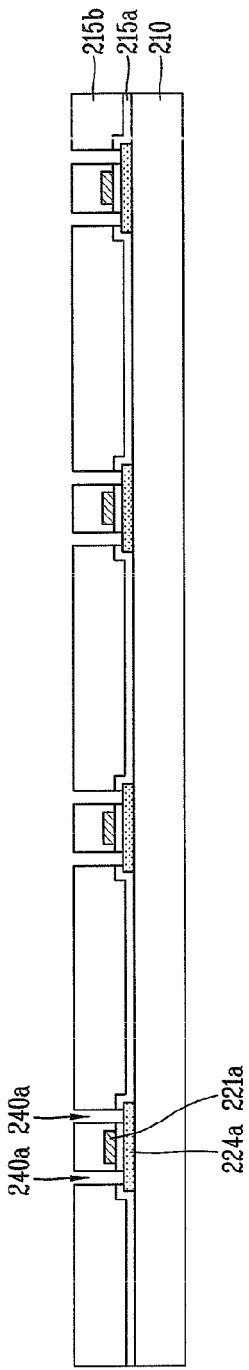

Next, as illustrated in FIGS. 10C and 11C, a first passivation layer 215b made of silicon nitride or silicon dioxide may be formed on a front surface of the substrate 210 formed with the gate line 216 including the first gate electrode 221 and the storage electrode 220 including the second gate electrode 221a and then the first passivation layer 215b and gate insulating layer 215a may be selectively patterned through the photolithography process to form a first contact hole 240 for exposing the source/drain regions of the first active layer 224 and a second contact hole 240a for exposing the source/drain regions of the second active layer 224a.

Figure 10D:
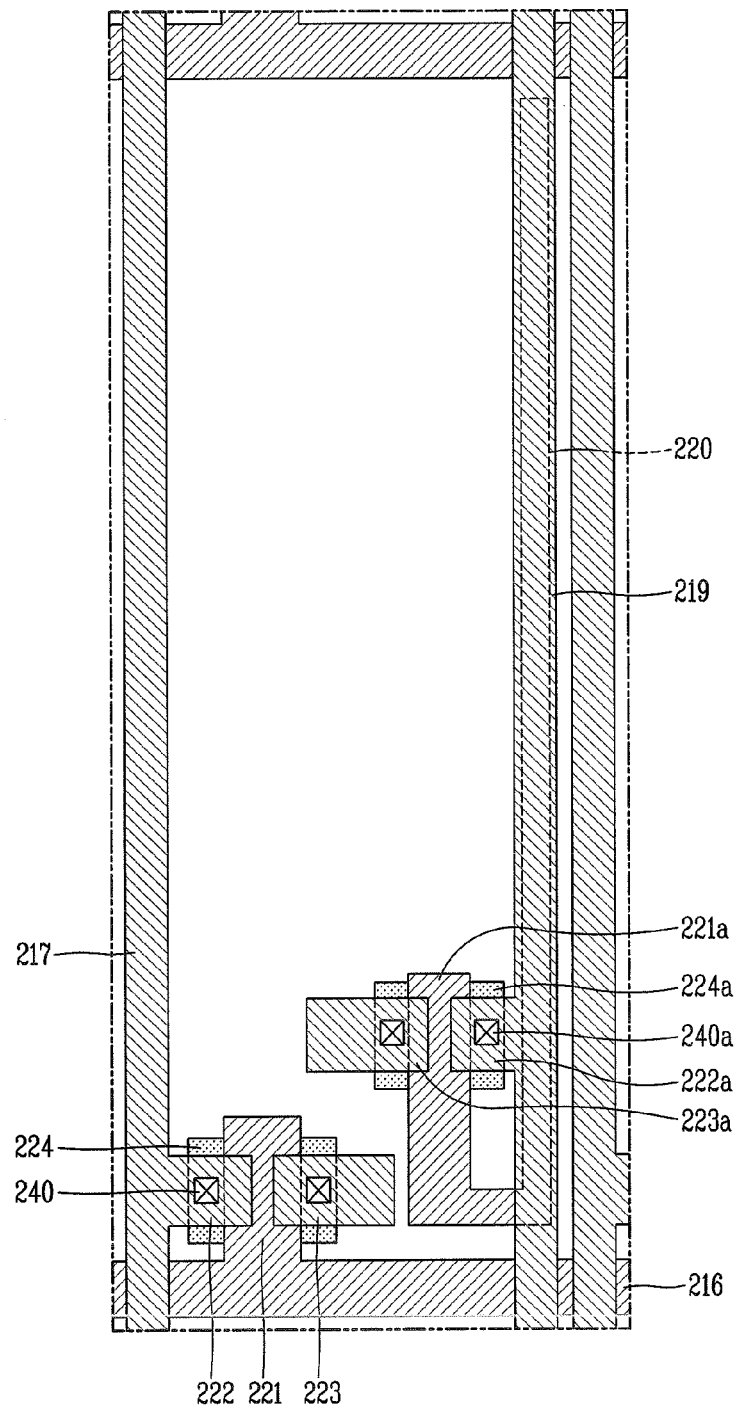
Figure 11D:
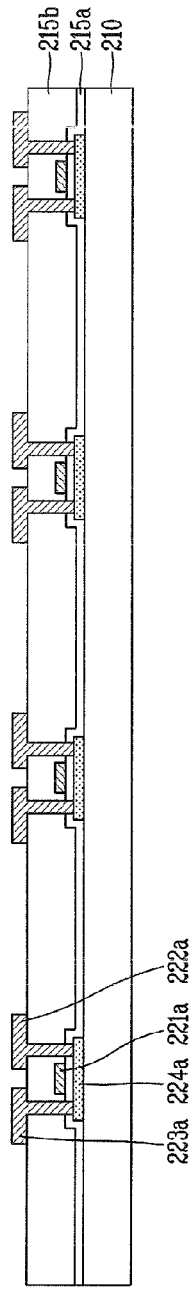

Then, as illustrated in FIGS. 10D and 11D, a second conductive layer may be formed on a front surface of the substrate 210 formed with the first passivation layer 215b, and then the second conductive layer may be selectively removed through the photolithography process to form a data line 217, a driving voltage line 219, first source/drain electrodes 222, 223, and second source/drain electrodes 222a, 223a which are made of the second conductive layer.

In this case, the first source/drain electrodes 222, 223 may be electrically connected to the source/drain regions of the first active layer 224 through the first contact hole 240 whereas the second source/drain electrodes 222a, 223a may be electrically connected to the source/drain regions of the second active layer 224a through the second contact hole 240a.

Figure 10E:
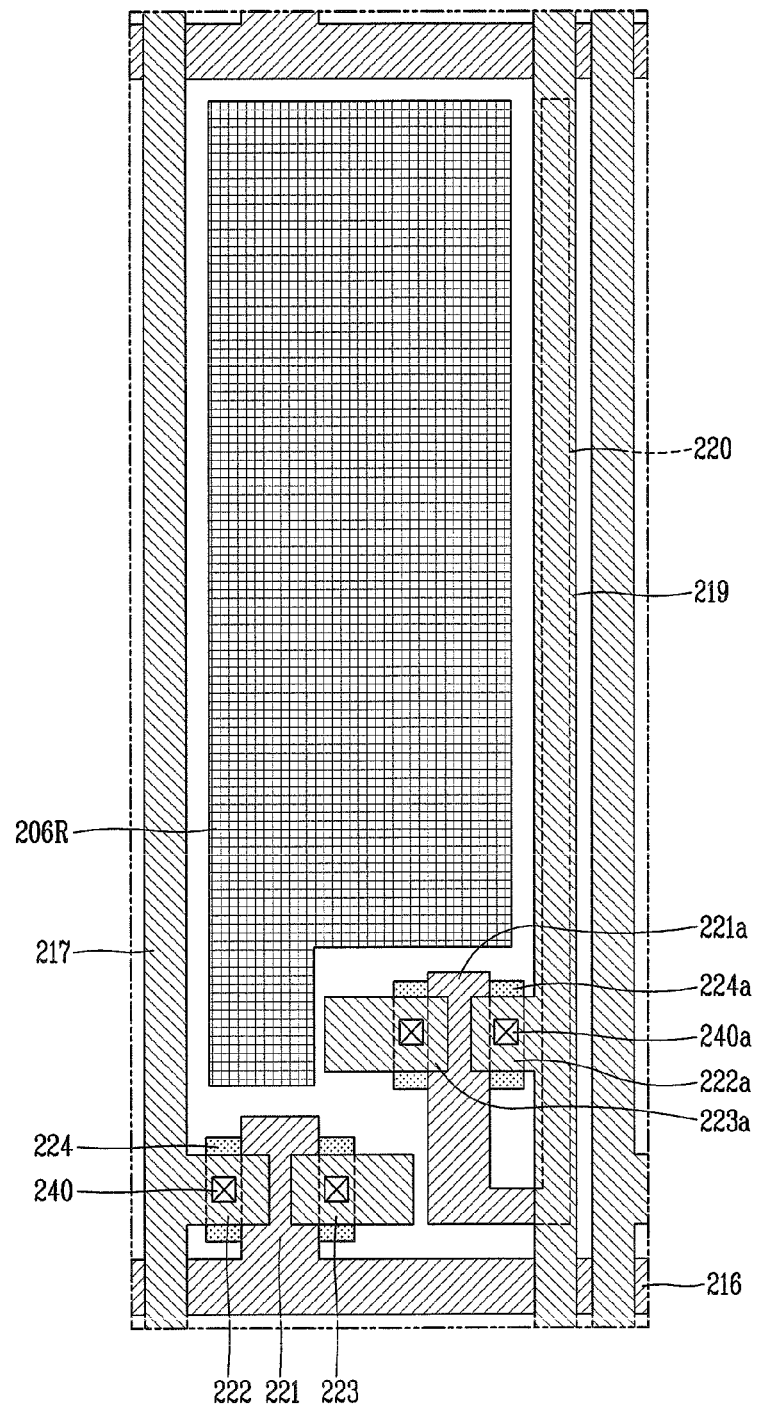
Figure 11E:
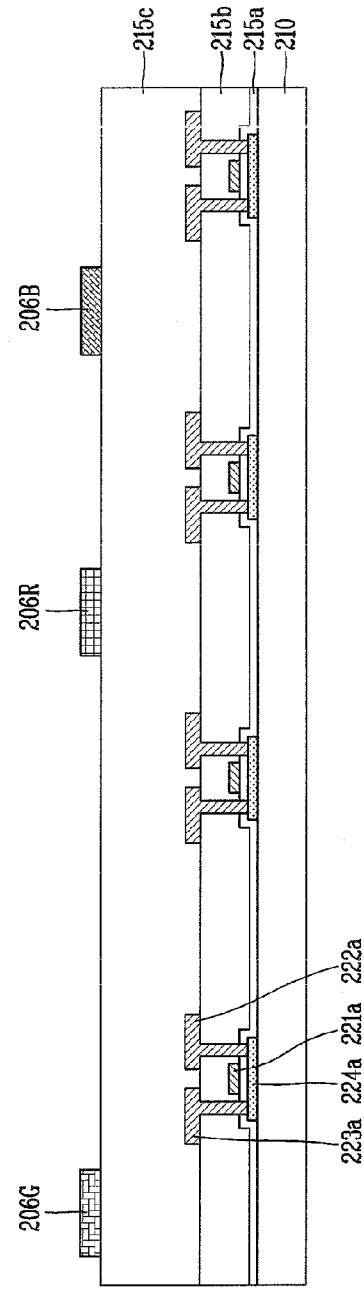

Next, as illustrated in FIGS. 10E and 11E, a second passivation layer 215c made of silicon nitride or silicon dioxide may be formed on a front surface of the substrate 210 formed with the data line 217, driving voltage line 219, first source/drain electrodes 222, 223, and second source/drain electrodes 222a, 223a, and then a red, green and blue color filter 206R, 206G, 206B may be formed in a pixel region thereon.

Subsequently, a curing process may be carried out for one hour at temperature of 230° C. to remove outgas within the red, green and blue color filter 206R, 206G, 206B.

Figure 10F:
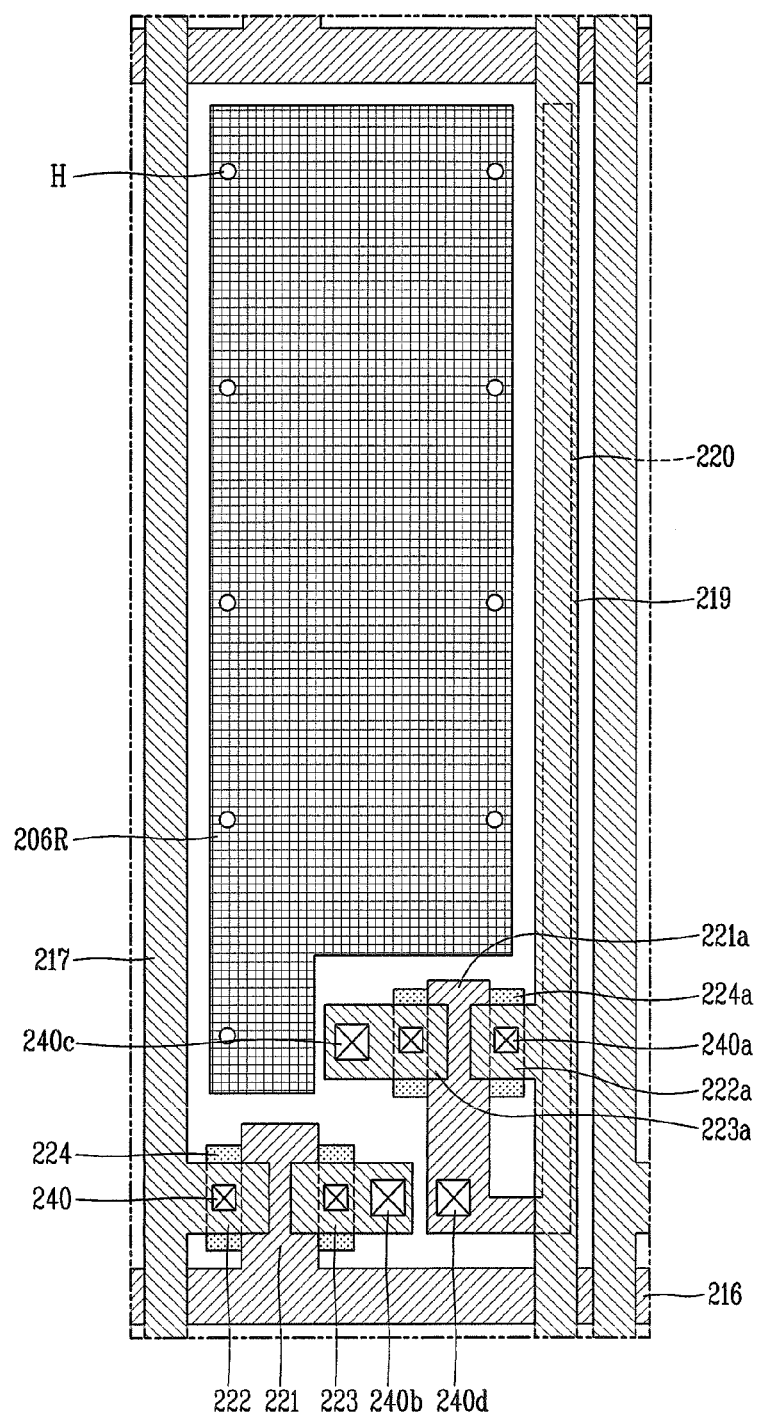

Next, as illustrated in FIGS. 10F and 11F, a third passivation layer 215d made of silicon nitride or silicon dioxide may be formed on a front surface of the substrate 210 formed with the red, green and blue color filter 206R, 206G, 206B.

In this case, as described above, according to a second embodiment of the present invention, silicon nitride having a low WVTR may be used as the third passivation layer 215d, similarly to the first embodiment, to effectively block outgas generated from the color filter, thereby preventing pixel shrinkage due to outgas. As a result, it may be possible to obtain an effect of securing the reliability of a white organic light emission layer.

Further, in a W-OLED display device according to a second embodiment of the present invention, a third passivation layer 215d having a thickness of 1000-5000 Å may be formed by using silicon nitride, instead of a planarization layer having a thickness of 2-3 µm in the prior art, thereby suppressing the generation of fine light beams in a non-emitting region to enhance color characteristics. However, the present invention will not be limited to this.

Subsequently, the third passivation layer 215d and second passivation layer 215c may be selectively removed through the photolithography process to form a third contact hole 240b and a fourth contact hole 240c for exposing the first drain electrode 223 and second drain electrode 223a, respectively, whereas the third passivation layer 215d, second passivation layer 215c, and first passivation layer 215b may be selectively removed to form a fifth contact hole 240d for exposing the second drain electrode 123a.

Further, the third passivation layer 215d on the red, green and blue color filter 206R, 206G, 206B may be selectively removed through the photolithography process to form a plurality of holes (H) for exposing the red, green and blue color filter 206R, 206G, 206B. In this case, the holes (H) may be formed on the third passivation layer 215d at an upper circumferential portion of the red, green and blue color filter 206R, 206G, 206B, and an example is illustrated in the drawing that the holes (H) are formed within a pixel region, for the sake of brevity of explanation. However, the present invention will not be limited to this, and the holes (H) may be also formed out of a pixel region such as an upper portion of the data line 217 or gate line 216.

Subsequently, for example, a curing process may be carried out for one hour at temperature of 230° C., thereby removing outgas within the red, green and blue color filter 206R, 206G, 206B that has still remained during the previous curing process through the holes (H).

Figure 10G:
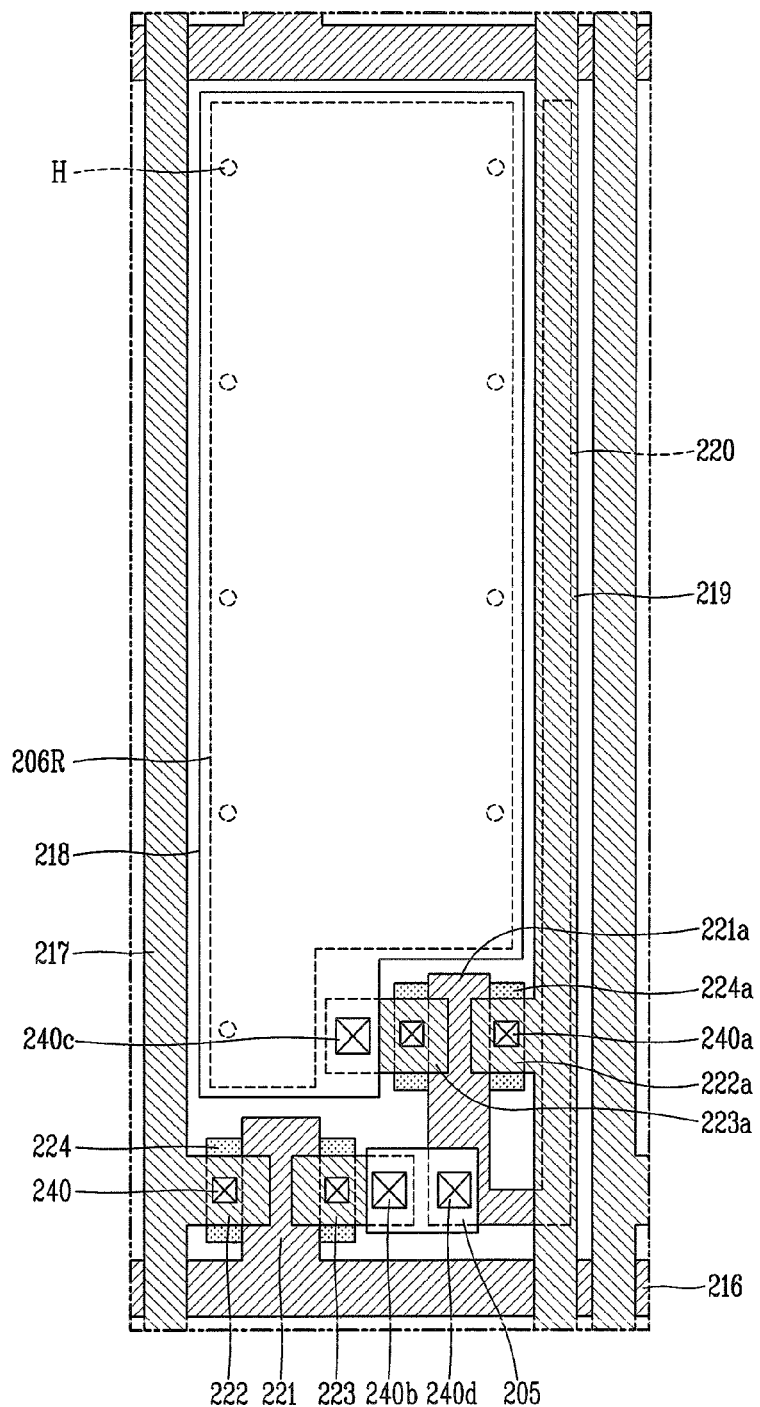

Then, as illustrated in FIGS. 10G and 11G, a third conductive layer may be formed on a front surface of the substrate 210 formed with the third passivation layer 215d, and then the third conductive layer may be selectively removed through the photolithography process to form a pixel electrode 218 and a connecting electrode 205 made of the third conductive layer.

The pixel electrode 218 which is an anode may be electrically connected to the second drain electrode 223a through the fourth contact hole 240c whereas the connecting electrode 205 is electrically connected between the first drain electrode 223 and second gate electrode 221a through the third contact hole 240b and fifth contact hole 240d.

Next, as illustrated in FIG. 11H, a partition 225 for partitioning between sub-pixels may be formed on the substrate 210 formed with the pixel electrode 218 and connecting electrode 205.

Then, as illustrated in FIG. 11I, a white organic light emission layer 230 may be formed on the substrate 210 formed with the partition 225.

Figure 11J:
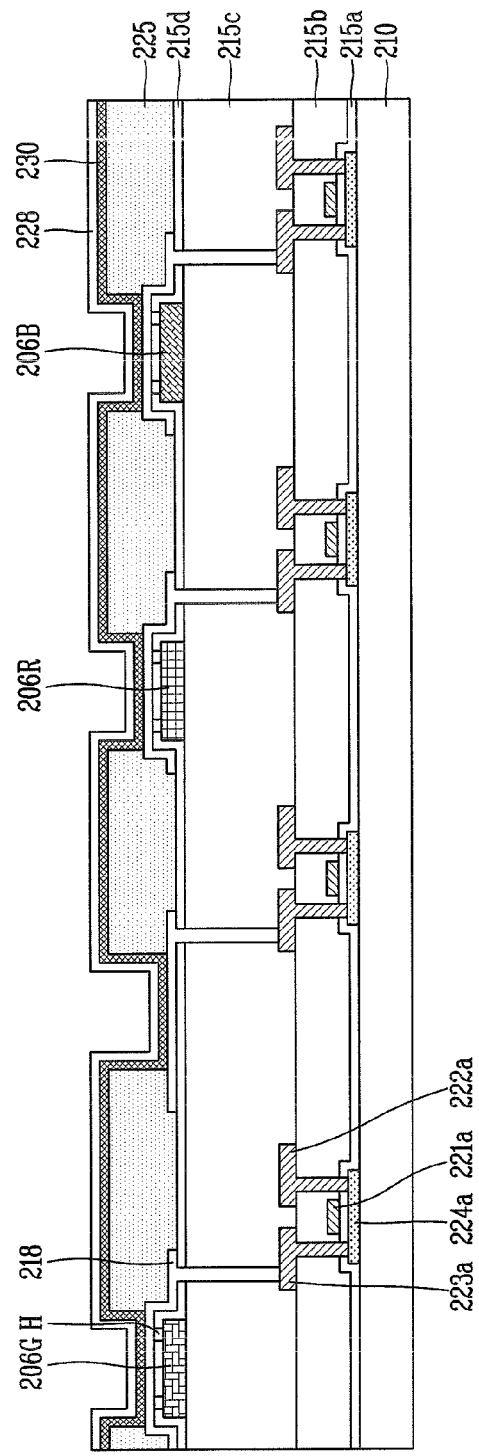

Next, as illustrated in FIG. 11J, a common electrode 228 which is a cathode may be formed on the organic light emission layer 230. As described above, in a W-OLED display device according to a second embodiment of the present invention, silicon nitride having a low water vapor transmission rate may be used as a third passivation layer, instead of a planarization layer which is an organic insulating layer, thereby effectively blocking outgas generated from the color filter. As a result, holes may be formed on the third passivation layer to remove the outgas in advance, thereby enhancing the reliability.

However, the present invention will not be limited to this, and may be also applicable to a case of forming holes on the planarization layer, and it will be described in detail through a third embodiment of the present invention.

In this case, the third embodiment of the present invention may include substantially same elements as the foregoing second embodiment of the present invention other than the configuration of forming a planarization layer using photo acryl.

Figure 12:
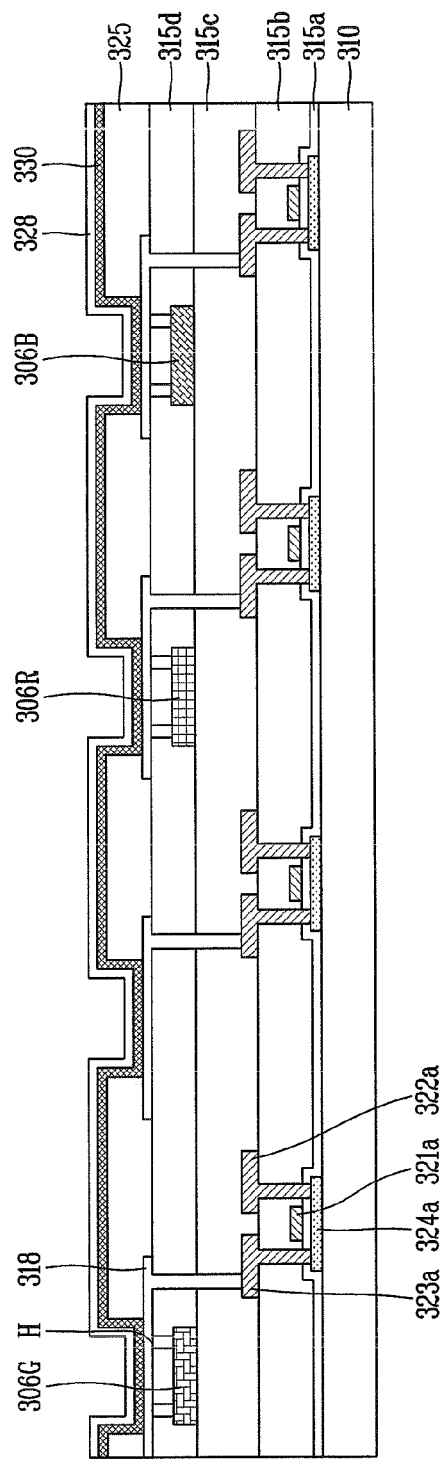
FIG. 12 is a cross-sectional view schematically illustrating the structure of a white organic light emitting diode display device according to a third embodiment of the present invention.

FIG. 12 is a cross-sectional view schematically illustrating the structure of a white organic light emitting diode display device according to a third embodiment of the present invention, which illustrates one pixel in a W-OLED display device being operated in a bottom emission scheme. However, the present invention will not be applicable only to the bottom emission scheme, and also applicable to a top emission scheme.

As illustrated in the drawings, in a W-OLED display device according to a third embodiment of the present invention, a first active layer (not shown) and a second active layer 324a made of polycrystalline silicon may be formed on a substrate 310 made of an insulating material such as transparent glass or plastic.

A gate insulting layer 315a made of silicon nitride or silicon dioxide may be formed on the substrate 310 including the first active layer and second active layer 324a, and a gate line (not shown) including a first gate electrode (not shown) and a storage electrode (not shown) including a second gate electrode 321a may be formed thereon.

A first passivation layer 315b made of silicon nitride or silicon dioxide may be formed on the gate line including the first gate electrode and the storage electrode including the second gate electrode 321a, and a data line (not shown), a driving voltage line (not shown), first source/drain electrodes (not shown), and second source/drain electrodes 322a, 323a are formed thereon.

The first source/drain electrodes may be electrically connected to the source/drain regions of the first active layer through the first contact hole, and the second source/drain electrodes 322a, 323a may be electrically connected to the source/drain regions of the second active layer 324a through the second contact hole.

A second passivation layer 315c made of silicon nitride or silicon dioxide may be formed on the substrate 210 formed with the data line, driving voltage line, first source/drain electrodes, and second source/drain electrodes 322a, 323a, and a red, green and blue color filter 306R, 306G, 306B may be formed in a pixel region thereon.

A third passivation layer 315d made of an organic insulating layer such as photo acryl may be formed on a front surface of the substrate 310 formed with the red, green and blue color filter 306R, 306G, 306B.

In this case, according to a third embodiment of the present invention, a plurality of holes (H) may be formed on the third passivation layer 315d at an upper circumferential portion of the red, green and blue color filter 306R, 306G, 206B, similarly to the foregoing second embodiment, thereby removing outgas within the red, green and blue color filter 306R, 306G, 306B in advance through the holes (H) using a predetermined curing process. In this case, the curing process may be carried out for about one hour at temperature of 230° C., but the present invention will not be limited to this. The holes (H) may be also formed out of a pixel region such as an upper portion of the data line or gate line.

In this case, a third contact hole (not shown) and a fourth contact hole for exposing the first drain electrode and second drain electrode 323a, respectively, may be formed on the third passivation layer 315d and second passivation layer 315c, and a fifth contact hole (not shown) for exposing the second gate electrode 321a may be formed on the third passivation layer 315d, second passivation layer 315c, and first passivation layer 315b.

Further, a pixel electrode 318 and a connecting electrode (not shown) may be formed on the third passivation layer 315d.

In this case, the pixel electrode 318 which is an anode may be electrically connected to the second drain electrode 323a through the fourth contact hole whereas the connecting electrode is electrically connected between the first drain electrode and second gate electrode 321a through the third contact hole and fifth contact hole.

A partition 325 may be formed on the substrate 310 formed with the pixel electrode 318.

A white organic light emission layer 330 may be formed on the substrate 310 formed with the partition 325.

A common electrode 328 which is a cathode may be formed on the organic light emission layer 330.

Hereinafter, a method of fabricating a W-OLED display device having the foregoing configuration according to a third embodiment of the present invention will be described in detail with reference to the accompanying drawings.

FIGS. 13A through 13J are cross-sectional views sequentially illustrating a method of fabricating a white organic light emitting diode display device according to a third embodiment of the present invention as illustrated in FIG. 12, which illustrate a method of fabricating a pixel including a thin-film transistor for the sake of brevity of explanation.

As illustrated in FIG. 13A, a buffer layer (not shown) and a silicon layer may be formed on the substrate 310 made of an insulating material such as transparent glass, plastic or the like.

The silicon layer may be formed of amorphous silicon or polycrystalline silicon, but according to the third embodiment an example is illustrated that a thin-film transistor is formed by using polycrystalline silicon.

Subsequently, the silicon layer may be selectively removed through the photolithography process to form a first active layer (not shown) and a second active layer 324a made of the polycrystalline silicon.

Next, as illustrated in FIG. 13B, a gate insulating layer 315a made of silicon nitride or silicon dioxide may be formed on the substrate 310 formed with the first active layer and second active layer 324a, and the gate line (not shown) including the first gate electrode (not shown) and the storage electrode (not shown) including the second gate electrode 321a may be formed thereon.

In this case, the gate line including the first gate electrode and the storage electrode including the second gate electrode 321a may be formed by depositing a first conductive layer on a front surface of the substrate 310 and then selectively patterning the conductive layer through a photolithography process.

Next, as illustrated in FIG. 13C, a first passivation layer 315b made of silicon nitride or silicon dioxide may be formed on a front surface of the substrate 310 formed with the gate line including the first gate electrode and the storage electrode including the second gate electrode 321a, and then the first passivation layer 315b and gate insulating layer 315a may be selectively patterned through the photolithography process to form a first contact hole (not shown) for exposing the source/ drain regions of the first active layer and a second contact hole 340*a* for exposing the source/drain regions of the second active layer 324*a*.

Figure 13D:
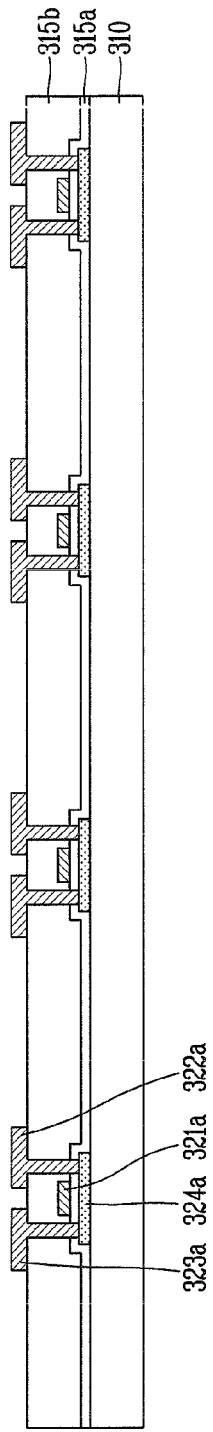

Then, as illustrated in FIG. 13D, a second conductive layer may be formed on a front surface of the substrate 310 formed with the first passivation layer 315*b*, and then the second conductive layer may be selectively removed through the photolithography process to form a data line (not shown), a driving voltage line (not shown), first source/drain electrodes (not shown), and second source/drain electrodes 322*a*, 323*a* which are made of the second conductive layer.

In this case, the first source/drain electrodes may be electrically connected to the source/drain regions of the first active layer through the first contact hole whereas the second source/drain electrodes 322*a*, 323*a* may be electrically connected to the source/drain regions of the second active layer 324*a* through the second contact hole 340*a*.

Figure 13E:
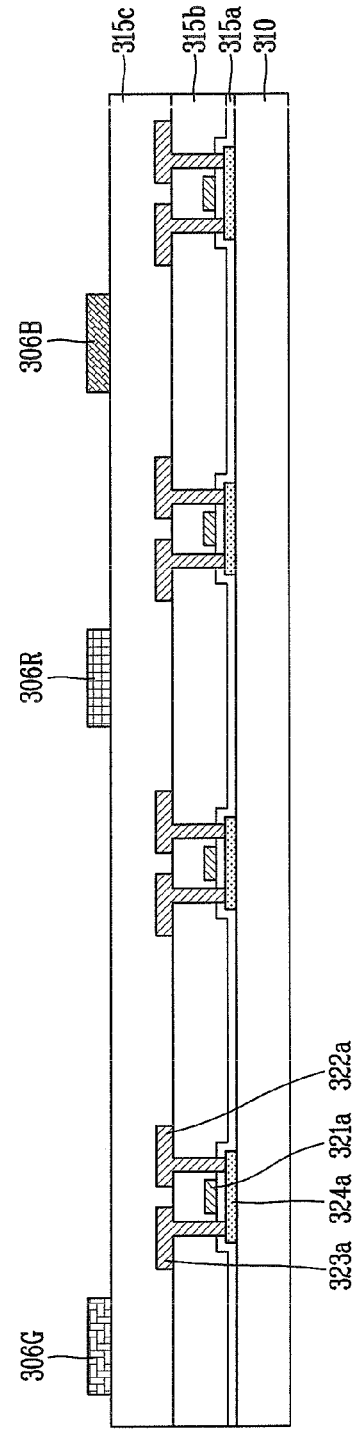

Next, as illustrated in FIG. 13E, a second passivation layer 315*c* made of silicon nitride or silicon dioxide may be formed on a front surface of the substrate 310 formed with the data line, driving voltage line, first source/drain electrodes, and second source/drain electrodes 322*a*, 323*a*, and then a red, green and blue color filter 306R, 306G, 306B may be formed in a pixel region thereon.

Subsequently, a curing process may be carried out for one hour at temperature of 230° C., for example, to remove outgas within the color filter 306R, 306G, 306B.

Next, as illustrated in FIG. 13F, a third passivation layer 315*d* made of an organic insulating layer such as photo acryl may be formed on a front surface of the substrate 310 formed with the red, green and blue color filter 306R, 306G, 306B.

Subsequently, though not shown in the drawing, the third passivation layer 315*d* and second passivation layer 315*c* may be selectively removed through a photolithography process to form a third contact hole (not shown) and a fourth contact hole (not shown) for exposing the first drain electrode and second drain electrode, respectively, whereas the third passivation layer 315*d*, second passivation layer 315*c*, and first passivation layer 315*b* may be selectively removed to form a fifth contact hole (not shown) for exposing the second gate electrode 321*a*.

Further, the third passivation layer 315*d* on the red, green and blue color filter 306R, 306G, 306B may be selectively removed through the photolithography process to form a plurality of holes (H) for exposing the red, green and blue color filter 306R, 306G, 306B. In this case, the holes (H) may be formed on the third passivation layer 315*d* at an upper circumferential portion of the red, green and blue color filter 306R, 306G, 306B, and an example is illustrated in the drawing that the holes (H) are formed within a pixel region, for the sake of brevity of explanation. However, the present invention will not be limited to this, and the holes (H) may be also formed out of a pixel region such as an upper portion of the data line or gate line.

Subsequently, for example, a curing process may be carried out for one hour at temperature of 230° C., thereby removing outgas within the red, green and blue color filter 306R, 306G, 306B that has still remained during the previous curing process through the holes (H).

Then, as illustrated in FIG. 13G, a third conductive layer may be formed on a front surface of the substrate 310 formed with the third passivation layer 315*d*, and then the third conductive layer may be selectively removed through the photolithography process to form a pixel electrode 318 and a connecting electrode (not shown) made of the third conductive layer.

The pixel electrode 318 which is an anode may be electrically connected to the second drain electrode 323*a* through the fourth contact hole whereas the connecting electrode is electrically connected between the first drain electrode and second gate electrode 321*a* through the third contact hole and fifth contact hole.

Next, as illustrated in FIG. 13H, a partition 325 for partitioning between sub-pixels may be formed on the substrate 310 formed with the pixel electrode 318 and connecting electrode.

Then, as illustrated in FIG. 13I, a white organic light emission layer 330 may be formed on the substrate 310 formed with the partition 325.

Figure 13J:
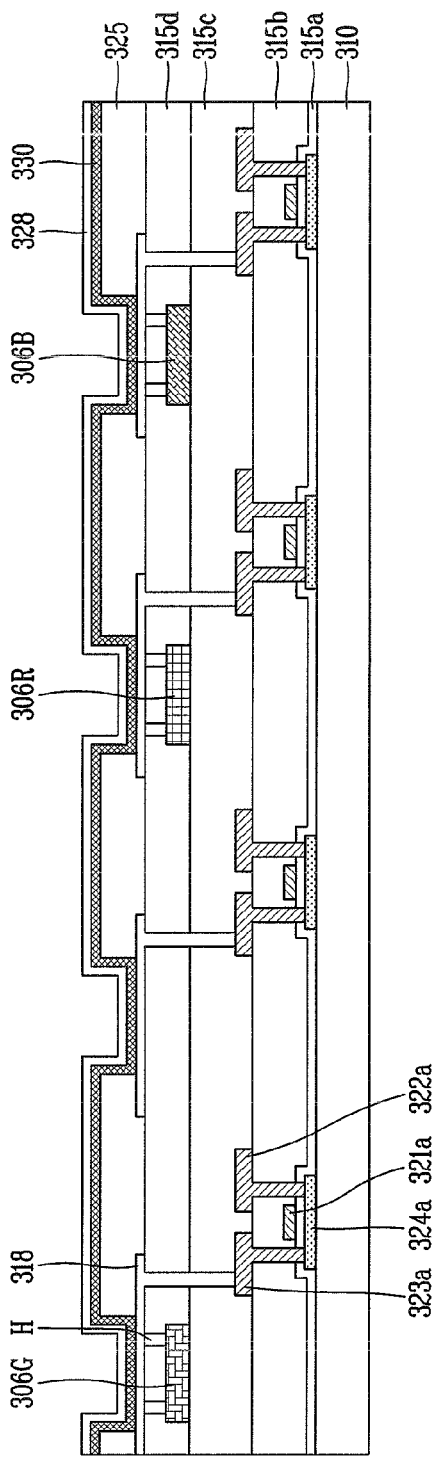

Next, as illustrated in FIG. 13J a common electrode 328 which is a cathode may be formed on the organic light emission layer 330.

As described above, in a W-OLED display device according to a third embodiment of the present invention, holes may be formed on a planarization layer to remove outgas generated from the color filter in advance, thereby enhancing the reliability.

Although many subject matters have been specifically disclosed in the foregoing description, they should be construed as an illustration of preferred embodiments rather than a limitation to the scope of invention. Consequently, the invention should not be determined by the embodiments disclosed herein but should be determined by the claims and the equivalents thereof.

What is claimed is:

1. A white organic light emitting diode (W-OLED) display device, comprising:
   a substrate divided into a thin-film transistor region and a light emitting region;
   a first thin-film transistor and a second thin-film transistor formed on the substrate of the thin-film transistor region;
   a first passivation layer formed on an entire surface of the substrate including the thin-film transistor region formed with the first thin-film transistor and the second thin-film transistor;
   a red, green, and blue color filters formed on a portion of the first passivation layer except the thin-film transistor region;
   a second passivation layer formed on the substrate formed with the color filters
   a pixel electrode formed on the second passivation layer, and connected to a drain electrode of the second thin-film transistor;
   a partition formed on the substrate formed with the pixel electrode to partition the light emitting region;
   a organic white light emission layer formed at the light emitting region of the substrate formed with the partition; and
   a common electrode formed on the substrate formed with the organic light emission layer.

2. The W-OLED display device of claim 1, wherein the plurality of holes are formed at an upper circumferential portion of the red, green and blue color filters.

3. The W-OLED display device of claim 1, wherein the second passivation layer is formed by using silicon nitride.

4. The W-OLED display device of claim 1, wherein the second passivation layer is formed by using the silicon nitride to block outgas generated from the color filters, and formed with a thickness of 1000-5000 Å to prevent the second passivation layer from being served as a wave guide.

5. The W-OLED display device of claim 1, further comprising a contact hole configured to expose the drain electrode of the second thin-film transistor, and formed in the first and second passivation layers at the thin-film transistor region of the substrate.

6. The W-OLED display device of claim 1, further comprising a plurality of holes configured to expose the color filters, and formed in the second passivation layer at the light emitting region of the substrate.

\* \* \* \* \*